United States Patent
Han et al.

(10) Patent No.: US 8,456,912 B2
(45) Date of Patent: Jun. 4, 2013

(54) NONVOLATILE MEMORY DEVICE AND METHOD FOR OPERATING THE SAME

(75) Inventors: Jung-Chul Han, Gyeonggi-do (KR); Seong-Je Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 209 days.

(21) Appl. No.: 13/104,475

(22) Filed: May 10, 2011

(65) Prior Publication Data

US 2012/0218818 A1  Aug. 30, 2012

(30) Foreign Application Priority Data

Feb. 28, 2011  (KR) ........................ 10-2011-0017930

(51) Int. Cl.
*G11C 11/34* (2006.01)

(52) U.S. Cl.
USPC ............. 365/185.12; 365/185.18; 365/185.19

(58) Field of Classification Search
USPC ............. 365/185.12, 185.03, 185.05, 185.11, 365/185.17, 185.18, 185.19
See application file for complete search history.

(56) References Cited

U.S. PATENT DOCUMENTS

| 2006/0291292 A1* | 12/2006 | Kwon et al. | 365/185.22 |
| 2007/0115724 A1* | 5/2007 | Hwang | 365/185.17 |
| 2008/0316833 A1* | 12/2008 | Fong et al. | 365/185.19 |
| 2010/0008145 A1* | 1/2010 | Wang | 365/185.19 |

FOREIGN PATENT DOCUMENTS

KR  1020100089504  8/2010

OTHER PUBLICATIONS

Notice of Allowance issued by the Korean Intellectual Property Office on Dec. 21, 2012.

* cited by examiner

*Primary Examiner* — Alexander Sofocleous
*Assistant Examiner* — Hien Nguyen
(74) *Attorney, Agent, or Firm* — IP & T Group LLP

(57) ABSTRACT

A nonvolatile memory device includes a page region including a plurality of normal cells and a plurality of auxiliary cells, a detecting unit configured to output a pass signal when at least one cell is programmed with a voltage higher than a reference voltage among program target cells of the page region, a count storing unit configured to store a count in the plurality of auxiliary cells during a first program operation for the page region, wherein the count indicates a total number of program pulses applied to the at least one cell until the pass signal is outputted from the detecting unit, and a voltage setting unit configured to set a program start voltage for a second program operation of the page region based on the count stored in the plurality of auxiliary cells.

51 Claims, 14 Drawing Sheets

NONVOLATILE MEMORY DEVICE AND METHOD FOR OPERATING THE SAME

CROSS-REFERENCE TO RELATED APPLICATIONS

The present application claims priority of Korean Patent Application No. 10-2011-0017930, filed on Feb. 28, 2011, which is incorporated herein by reference in its entirety.

BACKGROUND

1. Field

Exemplary embodiments of the present invention relate to semiconductor design technology, and more particularly, to a nonvolatile memory device and a method for operating the same.

2. Description of the Related Art

Nonvolatile memory devices are widely used as they are electrically programmed and erased and require no refresh function for rewriting data at a constant interval.

The program and erase operations of nonvolatile memory cells are performed by changing threshold voltages of cells, where the threshold voltage changes occur due to electrons that are moved by a strong electric field applied to a thin oxide layer. In the program operation of the nonvolatile memory cell, a verify operation is performed to verify whether a program target cell is programmed with a voltage equal to or higher than a verify voltage. In the case of a single level cell (SLC) program method, only cells with two different states exist and thus a single verify voltage is used. On the other hand, in the case of a multi level cell (MLC) program method, cells with several states exist in one page and thus a plurality of verify voltages are used. According to an example, in a case in which an MSB program operation is performed in a 2-bit multi level cell program method, a verify operation may be performed based on three verify voltages.

According to an incremental step pulse program (ISPP) method, a verify operation may be performed three times after each application of a pulse. At this time, a blind verify method which does not perform each verify operation at the same time but only some of the verify operations may be used in consideration for a program speed of a cell. However, as numbers of program/erase operations of the nonvolatile memory device increases, the program speed tends to increase. Thus, a program method taking into consideration such an increase in the program speed is useful.

FIG. 1 is a view illustrating a conventional multi level cell program method of a nonvolatile memory device.

In an LSB program operation, two different cell distributions are exhibited by a program operation. More specifically, a cell distribution in which a cell is programmed with a voltage equal to or higher than a verify voltage LPV1 is referred to as a second state, and a cell distribution in which a cell is programmed with a voltage lower than the verify voltage LPV1 is referred to as a first state.

After performing the LSB program operation, an MSB program operation is performed. Due to the MSB program operation, four cell distributions (three to sixth states) having different threshold voltages are exhibited. At this time, verify voltages are different for each distribution. If arranged in ascending order, the verify voltages include a first verify voltage MPV1, a second verify voltage MPV2, and a third verify voltage MPV3. More specifically, a state that is programmed with a voltage equal to or higher than the third verify voltage MPV3 is referred to as a sixth state. A state that is programmed with a voltage lower than the third verify voltage MPV3 and equal to or higher than the second verify voltage MPV2 is referred to as a fifth state. A state that is programmed with a voltage lower than the second verify voltage and equal to or higher than the first verify voltage MPV1 is referred to as a fourth state. A state that is programmed with a voltage lower than the first verify voltage MPV1 is referred to a third state. Here, cells to be programmed to the fourth state are defined as a first verify target cell, and cells to be programmed to the fifth state are defined as a second verify target cell. Cells to be programmed to the sixth state are defined as a third verify target cell.

In the MSB program operation, the verify operation is to be performed based on more verify voltages than in the LSB program operation.

FIG. 2 is a view illustrating the concept of a conventional ISPP program method of a nonvolatile memory device.

According to the ISPP program method, a program pulse is repeatedly applied, and a verify operation is performed at every repetition. The program pulse increased by a step voltage Vstep at each repetition is applied.

As illustrated in FIG. 2, a program start voltage Vstart is initially applied, and the program voltage increased by the step voltage Vstep is subsequently applied. The verify operation is performed whenever the program pulse is applied. Therefore, the entire time spent in applying the program pulse once is equal to the sum of a program pulse application time tPULSE and a verify time tVFY.

Meanwhile, a cell distribution (that is, a threshold distribution of cells) after initially applying the program start voltage Vstart to erased cells is defined as an inherent distribution ΔVthi. The inherent distribution spanning approximately 4 V (volt) is illustrated in FIG. 2. When the program operation is performed using the program start voltage Vstart, the step voltage Vstep, and the first verify voltage PV1, the distribution of cells each having a threshold voltage higher than the first verify voltage PV1 but still lower than the maximum voltage value for the inherent distribution ΔVthi is formed. At this time, the distribution of the programmed cells in voltage may be same as the magnitude of the step voltage Vstep (that is, the step voltage increase).

According to an example, the pulse application number Npgm of pulses used for completing the program operation is determined by the ratio of the inherent distribution ΔVthi to the step voltage Vstep. For instance, when the inherent distribution ΔVthi is 4 V and the step voltage Vstep is 1 V, the pulse are to be applied four times.

Time tPROG for completing the entire program operation is equal to the product of the pulse application number Npgm and the time (tPULSE+tVFY) for applying the program pulse once.

According to the characteristics of the ISPP program, the pulse application number Npgm is reduced as the step voltage Vstep increases. Consequently, the time tPROG spent for completing the entire program operation is reduced. However, since the distribution of the programmed cells in voltage is equal to the step voltage Vstep, the overall distribution may be widened.

FIG. 3 is a view illustrating a shift of a threshold voltage according to the application of a program pulse in a conventional ISPP program method.

According to an example, the program start voltage Vstart is 16 V, the step voltage Vstep is 1 V, and the inherent distribution ΔVthi is 4 V. A target voltage to be programmed is 1-2 V, and the verify voltage is 1 V.

In the initial application of the program pulse, a program voltage Vpgm is 16 V. After the initial application of the program pulse, the threshold voltages of the cells are determined according to the inherent distribution ΔVthi. Regarding the cells programmed with 1 V or higher after the initial application of the program pulse, data stored in the page buffer is changed and thus the next program pulse is not applied.

Upon the second application of the program pulse, the threshold voltages of the cells lower than 1 V are further increased due to the application of the program pulse. Specifically, the threshold voltages of the cells lower than 1 V may be increased by 1 V. It can be seen that the distribution of the cells after the initial application of the program pulse is increased by 1 V as a whole. However, as described above, since no program pulse is applied to the cells programmed with 1 V or higher upon the initial application of the program pulse, there is no further variation created in the threshold voltages of the corresponding cells.

In addition, at each of the third and fourth applications of the program pulse, the threshold voltage is increased by 1 V. Here, as described above, the distribution of the threshold voltage in the program completion state is identical to the magnitude of the step voltage.

FIG. 4 is a view illustrating a distribution variation according to different values of a program start voltage in a conventional ISPP program method.

Depending on whether the program start voltage Vstart is 16 V or 17 V (the inherent distribution ΔVthi is 4 V and the step voltage is 1 V), the distribution of the threshold voltage is different when the program operation is completed. More specifically, as the program start voltage Vstart becomes higher, the maximum threshold voltage further increases. According to an example, when the program start voltage Vstart is 16 V, the maximum threshold voltage is 2 V. When the program start voltage Vstart is 17 V, the maximum threshold voltage is 3 V. In this case, although the maximum threshold voltages in the program completion state are different, the distributions of the threshold voltage in both cases are equal to 1 V. As described above, this is because the distribution of the threshold voltage is determined by the step voltage Vstep.

As such, the program completion states differ according to variations in the program start voltage Vstart. In both cases, however, the program pulse application count number and the time for performing the program operation are same. In light of these characteristics, when the program operation is to be performed in the MLC program operation having several threshold voltage distribution states, one program start voltage may be commonly used. More specifically, over-program can be prevented when the program start voltage is set based on a cell having the lowest target threshold voltage.

According to an example, in a case in which the target threshold voltage is 1-2 V, if the program start voltage is set to 17 V, cells have a threshold voltage of 2-3 V due to the initial application of the program pulse, as illustrated in FIG. 4. Such cells are considered to have been over-programmed. Therefore, the program start voltage is set to 16 V when the program operation is performed.

FIG. 5 is a view illustrating a variation in a program speed of a nonvolatile memory device according to the number of program/erase operations.

In using the nonvolatile memory device, the program operation and the erase operation may be repeated several times. The program operation is performed on a page basis, and the erase operation is performed on a block basis. As the program/erase cycle number increases, the program speed of the nonvolatile memory device tends to get faster. More specifically, as the number program/erase operations increases, more charges tend to get trapped into a floating gate of the nonvolatile memory device. Thus, the program speed increases as compared to the conventional cells. At this time, the program speed may be defined as a variation of a threshold voltage with respect to one-time (that is, initial) application of a program pulse.

Therefore, in addition to the inherent distribution ΔVthi, which is the factor determining the program pulse application count number Npgm of the ISPP, the variation according to the increase in the number of the program/erase operations is to be additionally considered. The variation increases as the program/erase cycle number increases.

If the program start voltage is set in light of these characteristics, the program start voltage is to be set lower than in a case where a number of performed program/erase operations is minimal. More specifically, the low program start voltage is applied at the initial operation of the nonvolatile memory device in light of a change in the program speed according to the increase in the program/erase cycle number. Such a configuration has an effect that actually applies a dummy program pulse until it reaches a specific program/erase cycle number from the initial operation. Thus, the time for performing the program operation increases.

FIG. 6 is a view illustrating a conventional blind verify method of the nonvolatile memory device.

The blind verify method may be applied to the MLC program method. The specific example of a verify method illustrated in FIG. 6 is a verify method for use in a 2-bit multi level cell program operation. The verify operation is performed based on three verify voltages PV1, PV2 and PV3. Since the verify operation is performed based on the three verify voltages, the three-time verify operations is to be performed after the initial application of the program pulse.

However, as described above, since the program start voltage is set based on the lowest threshold voltage, no cells are programmed with the second verify voltage PV2 and the third verify voltage PV3 or higher, upon the initial application of the program pulse. More specifically, after the program pulse is somewhat applied, the cells are programmed with the second verify voltage PV2 and the third verify voltage PV3 or higher. Therefore, in order to reduce the time for performing the verify operation, only the verify operation based on the first verify voltage PV1 is performed after the program pulse during first several periods. Since some verify operations are skipped, the above-described verify method is called a blind verify method. In the blind verify method, the following features may occur when applying the program pulse applying method considering the variation in the program speed according to the program/erase verifying cycle number.

FIG. 7 is a view illustrating the concept of a conventional program/verify method with respect to an MSB program of a nonvolatile memory device.

According to a first program/verify method, only a verify operation based on a first verify voltage MPV1 is performed after an initial application of a program pulse, as described above in the blind verify method. In principle, verify operations based on a second verify voltage MPV2 and a third verify voltage MPV3 is to be performed. However, only the verify operation based on the first verify voltage is performed according to the above-described blind verify method.

After the program pulse application and the verify operation based on the first verify voltage are performed three times, the verify operations based on the first verify voltage and the second verify voltage are performed. In addition, after the verify operations based on the first verify voltage and the second verify voltage are performed three times, the verify operation based on the third verify voltage is performed. Meanwhile, the number of the verify operation based on the first verify voltage and the number of the verify operations based on the first and second verify voltages may be previously set.

A second program/verify method will be described below. The second program/verify method applies a lowered program start pulse in order to compensate for the tendency where the program speed increases as the program/erase cycle number increases. More specifically, as illustrated in FIG. 7, the lower program start pulse is applied as compared to the first program/verify method. However, such a compensation may not fully counter all features that occur according to the program/erase cycle number.

More specifically, since the program speed is fast when the program/erase cycle number is large, the variation in the threshold voltage is large even when a low program pulse is applied. Therefore, the verify operation is to be performed even when a low program voltage is applied. In addition, after the point of time (A) when the threshold voltage slightly rises, the verify operations based on the first and second verify voltages is to be performed.

However, since the program speed is slow when the program/erase cycle number is small, the variation in the threshold voltage from the application of a low program pulse is small. Therefore, when a low program voltage is applied, the need to perform the verify operation is reduced/obviated. In addition, since the increase in the threshold voltage is small, the need to perform the verify operation based on the second verify voltage after the verify operation based on the first verify voltage is reduced/obviated after the program pulse is increased to some degree (that is, after "A").

FIG. 8 is a view illustrating a conventional program/verify method of a nonvolatile memory device.

Referring to FIG. 8, when the above-described blind verify method is methodically applied to the nonvolatile memory device, the verify operation based on the second verify voltage, as well as the verify operation based on the first verify voltage, may be unnecessarily performed in the initial operation in which the program/erase cycle number is small.

In order to prevent such an operation, a blind verify method may be applied, for example, only when a cell programmed with a voltage equal to or higher than the first verify voltage is detected.

More specifically, as shown, the first verify operation based on the first verify operation, and the ISPP program operation are alternately performed until a cell programmed with a voltage equal to or higher than the first verify voltage is detected. When the cell programmed with a voltage equal to or higher than the first verify voltage is detected, the program pulse application count number applied until the detection is stored, and the above-described blind verify method is performed by adjusting a program start voltage, based on the stored program pulse application count number, when another page region is programmed.

According to an example, a nonvolatile memory device may count the program pulse application count number applied until the cell programmed with a voltage equal to or higher than the first verify voltage is detected, while programming a first page region. It can be seen from FIG. 8 that the program pulse application count number applied to the first page region is 4. Therefore, a voltage corresponding to the sum of the program start voltage for the first page region and four times the step voltage is set as the program start voltage for the second page region. Since the program start voltage for the second page region is variably set based on the program result of the first page region, time for applying the dummy program pulse may be reduced. More specifically, as in the case of FIG. 8, time for applying the dummy program pulse four times and performing the verify operation during the operation of programming the second page region may be reduced.

Meanwhile, in a nonvolatile memory device, a latch included in a controller is used to store the program pulse application count number applied until the cell programmed with a voltage equal to or higher than the first verify voltage is detected.

A nonvolatile memory device may often include tens or hundreds of page regions. Thus, in order to store the program pulse application count numbers of all page regions included in the nonvolatile memory device, as many latches as the number of page regions are to be provided inside the controller. However, such a configuration is not practical.

Therefore, in a nonvolatile memory device, the program start voltage adjustable through the program operation of the set page regions is applied to the plurality of page regions adjacent to the set page regions where a small number of latches corresponding to a set portion of page regions are included in the controller.

However, if a difference in for example, process, the number of program cycles, etc. between the two page regions occurs, data may not be normally detected when the same value is applied to the two page regions, even if two page regions are adjacent to each other. Thus, a margin considering a difference between the two page regions is to be provided, even for two page regions adjacent to each other.

According to an example, even though a cell programmed with a voltage equal to or higher than the first verify voltage by the operation of applying the program pulse four times is detected upon programming a certain page region, cells programmed with a voltage equal to or higher than the first verify voltage by the operation of applying the program pulse two times or three times under the same condition may exist in an adjacent page region.

Thus, the method for operation as described above sets a margin in light of all factors including a semiconductor chip or operation plan. Here, a difference may occur in the performance of the program/verify method of the nonvolatile memory device according to the set margin.

SUMMARY

An exemplary embodiment of the present invention is directed to a program method which can minimize time for a verify operation in a program time of a nonvolatile memory device.

In accordance with an exemplary embodiment of the present invention, a nonvolatile memory device includes: a page region including a plurality of normal cells and a plurality of auxiliary cells; a detecting unit configured to output a pass signal when at least one cell is programmed with a voltage higher than a reference voltage among program target cells of the page region; a count storing unit configured to store a count in the plurality of auxiliary cells during a first program operation for the page region, wherein the count indicates a total number of program pulses applied to the at least one cell until the pass signal is outputted from the detecting unit; and a voltage setting unit configured to set a program start voltage for a second program operation of the page region based on the count stored in the plurality of auxiliary cells.

In accordance with another embodiment of the present invention, a nonvolatile memory device includes: first and second page regions sharing word lines, wherein the first and second page regions each include a plurality of normal cells and a plurality of auxiliary cells; a pass detecting unit configured to output a pass signal when at least one cell is programmed with a voltage higher than a reference voltage among program target cells of the first page region; a count storing unit configured to store a count in the plurality of auxiliary cells of the first page region during a first program operation of the first page region, wherein the count indicates a total number of program pulses applied to the at least one cell until the pass signal is outputted from the pass detecting unit; and a voltage setting unit configured to set a program start voltage for at least one of the first and second page regions based on the count.

In accordance with still another embodiment of the present invention, a nonvolatile memory device includes: first and second page regions sharing word lines, wherein the first and second page regions each include a plurality of normal cells and a plurality of auxiliary cells; a pass detecting unit configured to output a pass signal when at least one cell is programmed with a voltage higher than a reference voltage among program target cells of at least one of the first and second page region; a first voltage adjusting unit configured to store a first count in the plurality of auxiliary cells of the first page region and adjust a first program start voltage according to the stored first count, wherein the first count indicates a total number of program pulses applied to the first page region until the pass signal is outputted from the pass detecting unit; and a second voltage adjusting unit configured to store a second count in the plurality of auxiliary cells of the second page region and adjust a second program start voltage according to the stored second count, wherein the second count indicates a total number of program pulses applied to the second page region until the pass signal is outputted from the pass detecting unit.

In accordance with still another embodiment of the present invention, a method for operating a nonvolatile memory device includes: performing a first program operation of a page region by applying an initial program start voltage, the page region including a plurality of normal cells and a plurality of auxiliary cells; counting program pulses applied to the page region until at least one cell is programmed with a voltage higher than a verify voltage among program target cells of the page region and output a count during the first program operation; storing the count in the plurality of auxiliary cells; setting a program start voltage according to the count; and performing a second program operation of the page region by applying the program start voltage determined in the setting operation.

In accordance with further embodiment of the present invention, a method for operating a nonvolatile memory device includes: performing a program operation of a first page region by applying a first program start voltage, the first page region including a plurality of normal cells and a plurality of auxiliary cells; performing a program operation of a second page region by applying a second program start voltage, the second page region including a plurality of normal cells and a plurality of auxiliary cells and sharing word lines with the first page region; counting program pulses applied to the first page region until at least one cell is programmed with a voltage higher than a verify voltage among program target cells of the first page region during the program operation of the first page region and outputting a count; storing the count in the plurality of auxiliary cells of the first page region; and setting the second program start voltage according to the count stored in the plurality of auxiliary cells of the first page region.

In accordance with further another embodiment of the present invention, a method for operating a nonvolatile memory device includes: performing a program operation of a first page region by applying a first program start voltage, wherein the first page region includes a plurality of normal cells and a plurality of auxiliary cells; storing a count in the plurality of auxiliary cells of the first page region, wherein the count indicates a total number of program pulses applied to the first page region before at least one cell is programmed with a voltage higher than a verify voltage among program target cells of the first page region; setting the first program start voltage according to the count during the program operation of the first page region; performing a program operation of a second page region by selecting a second program start voltage, wherein the second page region includes a plurality of normal cells and a plurality of auxiliary cells and shares strings with the first page region; and determining a value of a voltage select signal for the selection of the second program start voltage according to the count during the program operation of the second page region.

DETAILED DESCRIPTION

Figure 1:
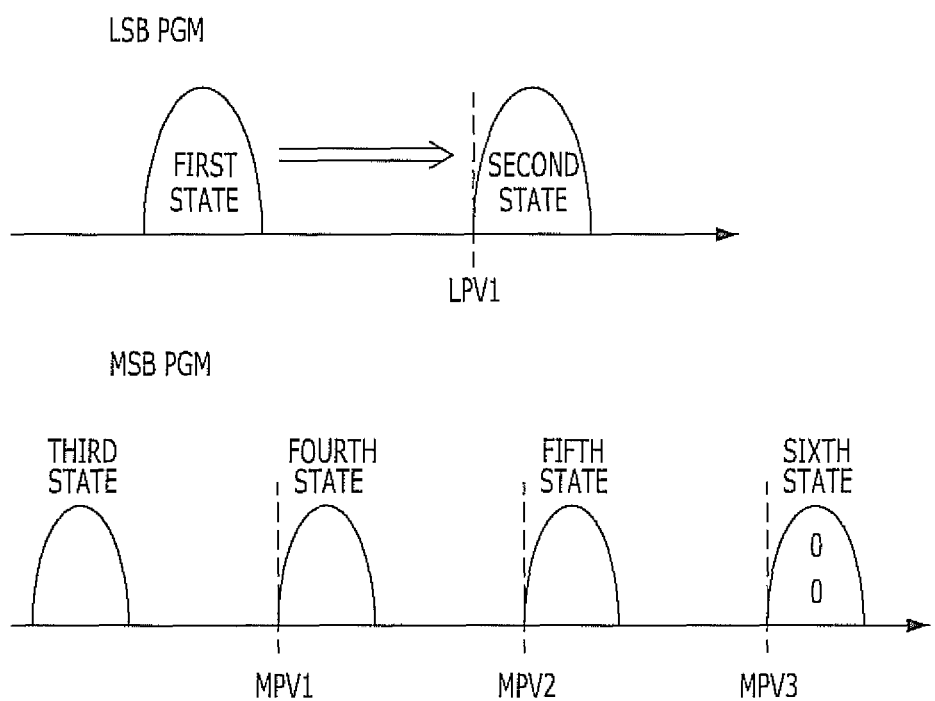
FIG. 1 is a view illustrating a conventional multi level cell program method of a nonvolatile memory device.

Exemplary embodiments of the present invention will be described below in more detail with reference to the accompanying drawings. The present invention may, however, be embodied in different forms and should not be construed as limited to an exemplary embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 9:
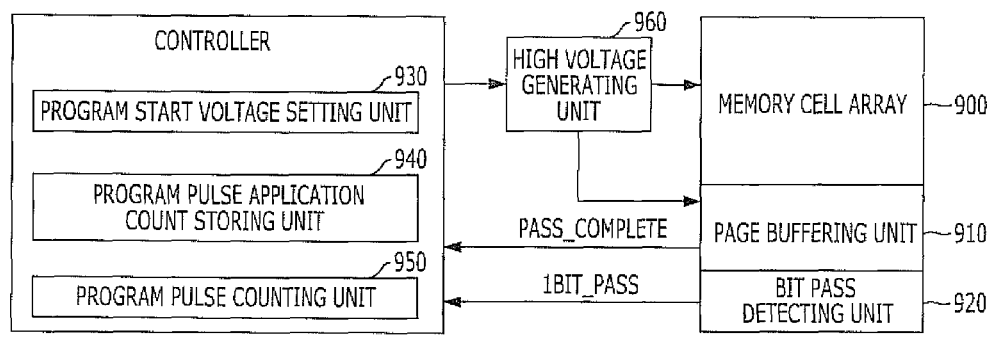
FIG. 9 is a block diagram illustrating a nonvolatile memory device in accordance with an exemplary embodiment of the present invention.

FIG. 9 is a block diagram illustrating a nonvolatile memory device in accordance with an exemplary embodiment of the present invention.

Figure 10:
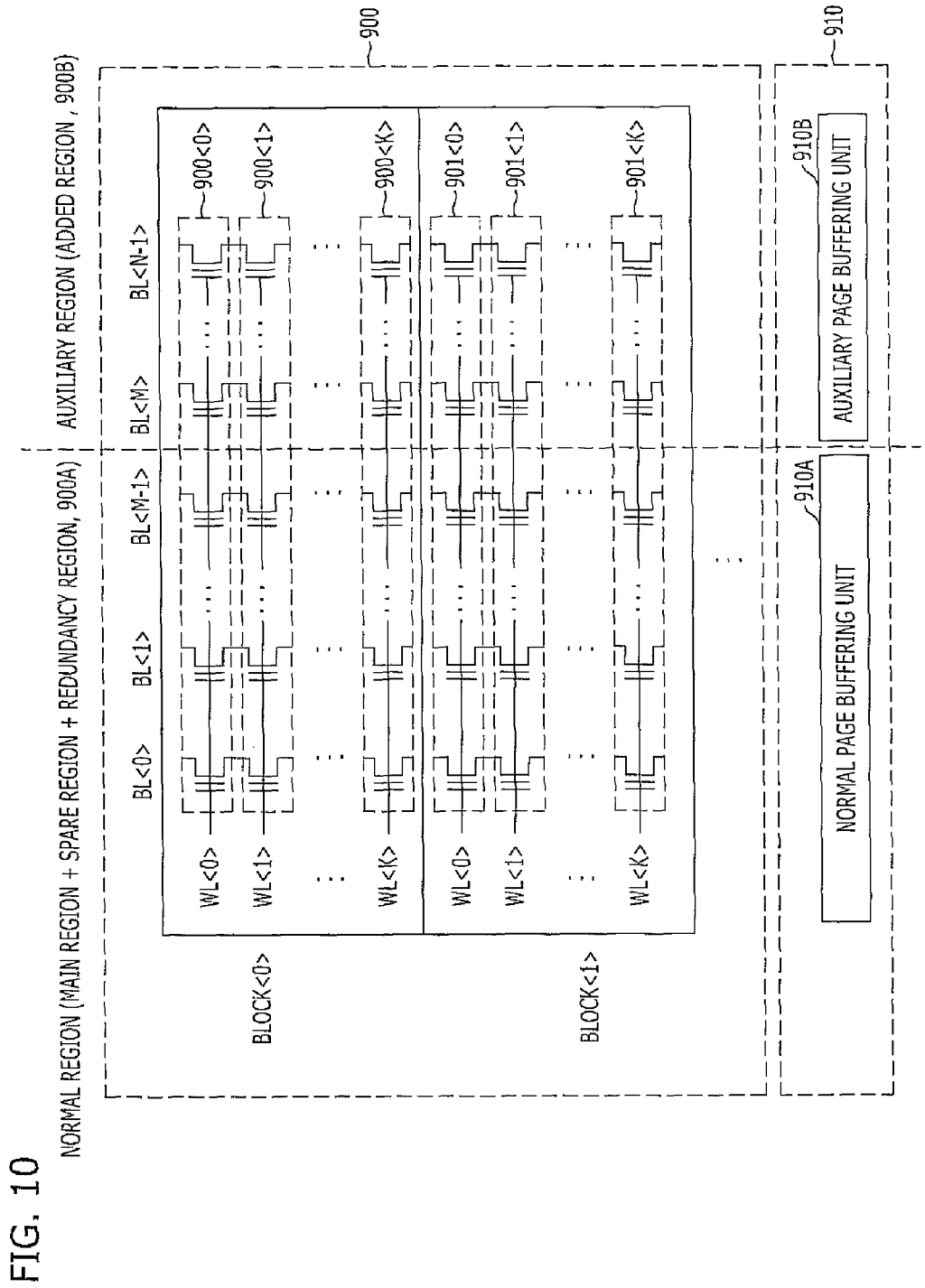
FIG. 10 is a detailed block diagram illustrating a first configuration of a memory cell array and a page buffering unit in the nonvolatile memory device of FIG. 9.

FIG. 10 is a detailed block diagram illustrating a first configuration of a memory cell array and a page buffering unit in the nonvolatile memory device of FIG. 9.

Referring to FIG. 9, the nonvolatile memory device in accordance with an exemplary embodiment of the present invention includes a nonvolatile memory cell array 900, a page buffering unit 910, a bit pass detecting unit 920, a controller, and a high voltage generating unit 960. The controller includes a program start voltage setting unit 930, a program pulse application count storing unit 940, and a program pulse counting unit 950.

According to an example, the controller performs various operations of the nonvolatile memory device such as a program operation, a read operation, and an erase operation. The controller receives external command, address and data and performs a related operation. In addition, the controller controls the high voltage generating unit 960 to apply a high voltage (a program voltage, a pass voltage, a read voltage, etc.) for each operation to the memory cell array 900. Furthermore, in the verify operation performed during the program operation, the controller confirms whether each memory cell is programmed with a reference voltage or high, and controls the program operation to be finished when a pass completion signal is inputted.

More specifically, the program start voltage setting unit 930, the program pulse application count storing unit 940, and the program pulse counting unit 950, which are included in the controller, are elements used for counting a number of time that the program pulses has been applied until the 1 bit pass time point, that is, the point of time when a cell programmed with a reference voltage or higher occurs among the program target cells of the page region, and setting the program start voltage according to the counted number of the program pulse applications.

The specific configuration of the nonvolatile memory device in accordance with an exemplary embodiment of the present invention is described with reference to FIG. 10 showing a detailed configuration of the memory cell array 900 and the page buffering unit 910.

First, the memory cell array 900 includes a normal region 900A and an auxiliary region 900B. Likewise, the page buffering unit 910 includes a normal page buffering unit 910A corresponding to the normal region 900A of the memory cell array 900 and an auxiliary page buffering unit 910B corresponding to the auxiliary region 900B.

The normal region 900A of the memory cell array 900 is a region including a main region, a spare region, and a redundancy region of the above-described nonvolatile memory device. On the other hand, the auxiliary region 900B of the memory cell array 900 is outside the normal region 900A. More specifically, the auxiliary region 900B of the memory cell array 900 is a region specially added to the nonvolatile memory device in accordance with an exemplary embodiment of the present invention. According to an example, the auxiliary region 900B may have a capacity for storing several bytes and may increase the entire size of the memory cell array 900. According to another example, a portion of the spare region or the redundancy region included in the above-described normal region 900A may be divided and set as the auxiliary region 900B instead of increasing the entire size of the memory cell array 900 by forming additional structure for the auxiliary region 900B.

Since the memory cell array 900 includes the normal region 900A and the auxiliary region 900B, a plurality of unit page regions 900<0:K>, 901<0:K>, . . . provided in the memory cell array 900 and including a plurality of cells each include a plurality of normal cells BL<0:M−1> and a plurality of auxiliary cells BL<M:N−1>. The bit pass detecting unit 920 outputs a 1 bit pass signal 1BIT_PASS when a cell is programmed with a voltage higher than a reference voltage among program target cells of the unit page regions 900<0:K>, 901<0:K>, . . . . The program pulse application count storing unit 940 stores the program pulse application count number, where the program pulse is applied until the 1 bit pass signal 1BIT_PASS is outputted during the first program operation on the unit page regions 900<0:K>, 901<0:K>, . . . , in the plurality of auxiliary cells BL<M:N−1>. The program start voltage setting unit 930 sets the program start voltage for the second program operation of the unit page regions 900<0:K>, 901<0:K>, . . . , based on the program pulse application count number stored in the plurality of auxiliary cells BL<M:N−1>.

In addition, the program pulse counting unit 950 counts the program pulses applied to the unit page regions 900<0:K>, 901<0:K>, . . . until the 1 bit pass signal 1BIT_PASS is outputted during the first program operation, and transfers the counted number of the program pulse applications to the program pulse application number storing unit 940.

Figure 11:
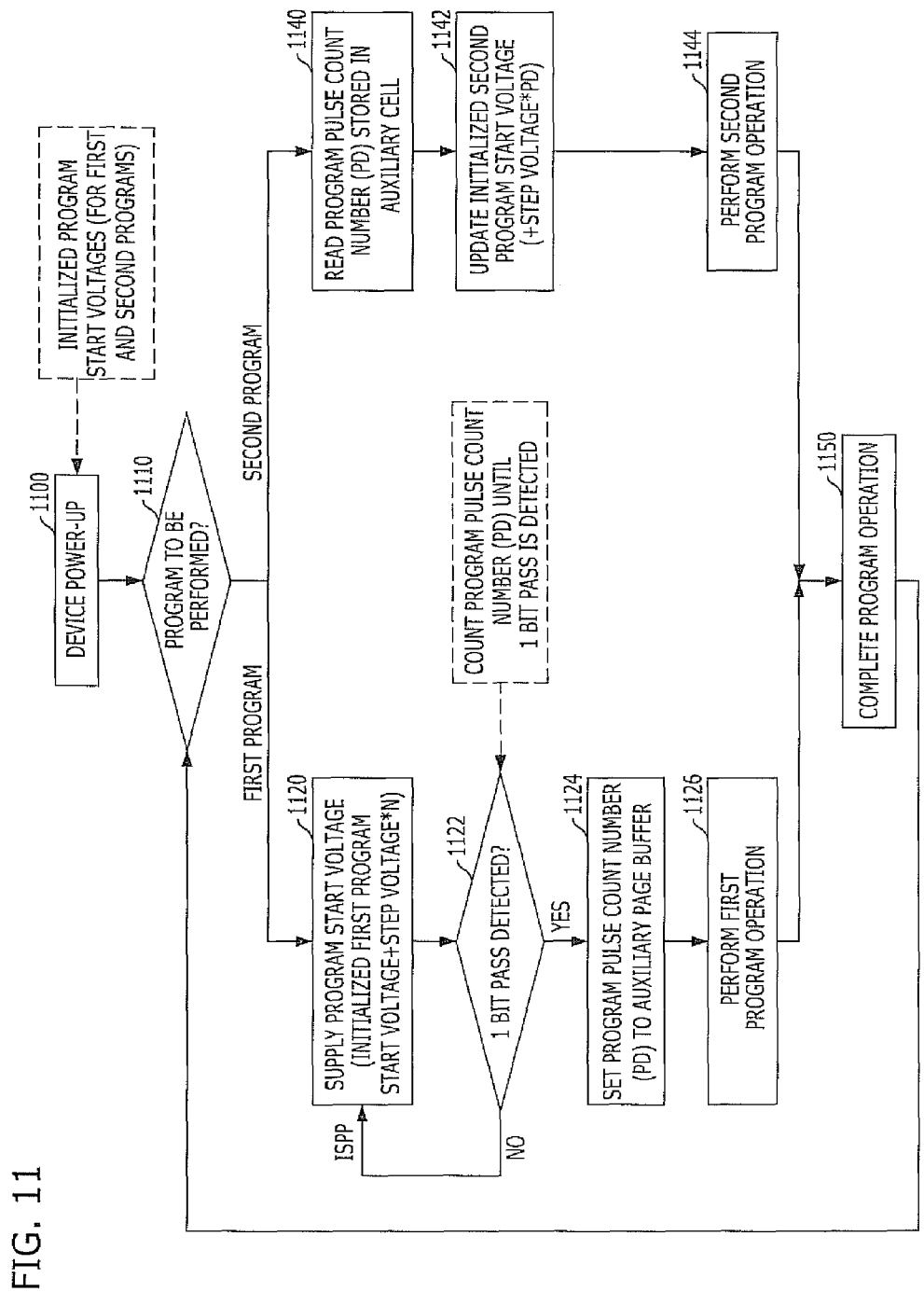
FIG. 11 is a flowchart explaining a program operation of the nonvolatile memory device of FIG. 9.

The plurality of cells provided in the memory cell array 900 are multi level cells (MLCs). Thus, the plurality of normal cells BL<0:M−1> and the plurality of auxiliary cells BL<M:N−1> included in the unit page regions 900<0:K>, 901<0:K>, . . . are multi level cells (MLCs). Therefore, the program operation of the nonvolatile memory device in accordance with an exemplary embodiment of the present invention is divided into the first program operation and the second program operation, as illustrated in the flowchart of FIG. 11. According to an example, the first program operation is an LSB program operation, and the second program operation is an MSB program operation.

The program operation of the nonvolatile memory device in accordance with an exemplary embodiment of the present invention is described below in detail with reference to the flowchart shown in FIG. 11.

Figure 2:
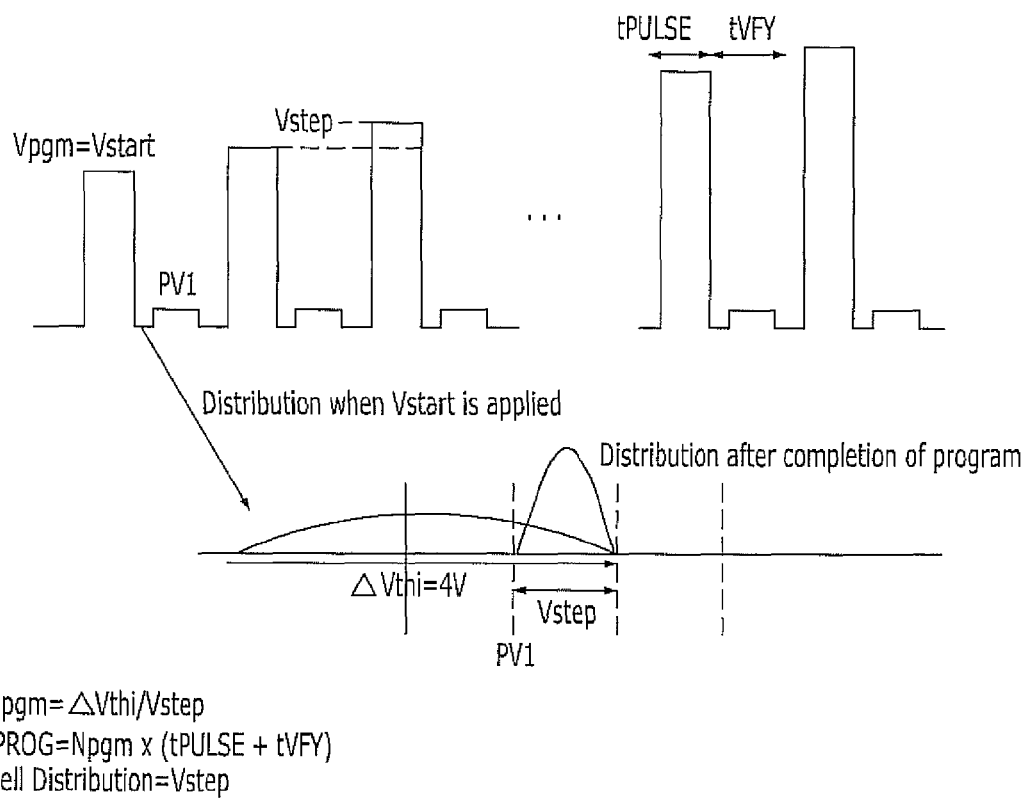
FIG. 2 is a view illustrating the concept of a conventional ISPP program method of a nonvolatile memory device.
Figure 3:
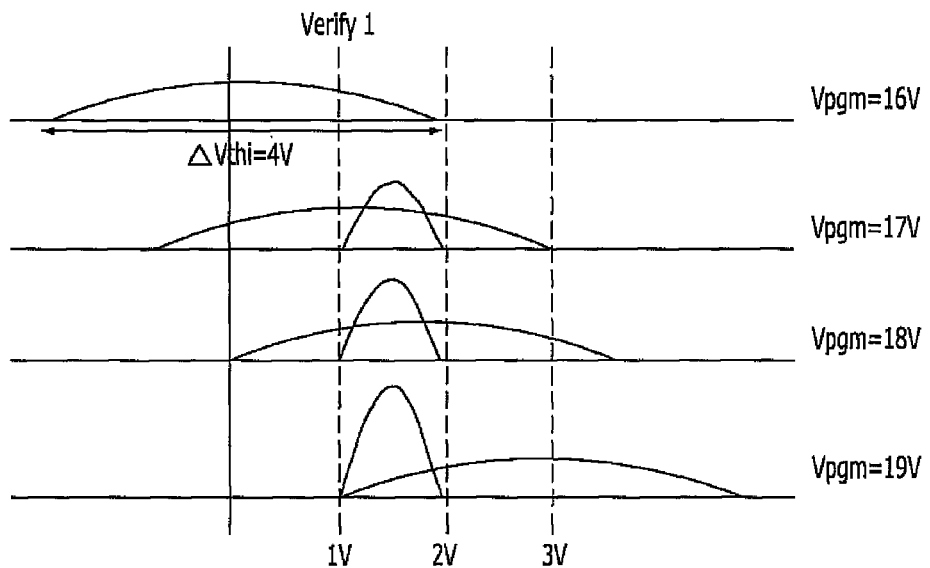
FIG. 3 is a view illustrating a shift of a threshold voltage according to the application of a program pulse in a conventional ISPP program method.
Figure 4:
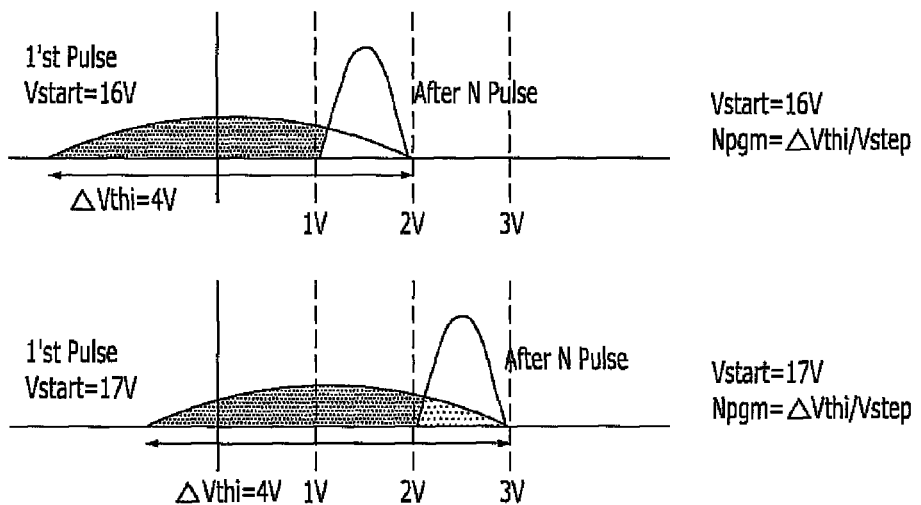
FIG. 4 is a view illustrating a distribution variation according to a setting of a program start voltage in a conventional ISPP program method.
Figure 5:
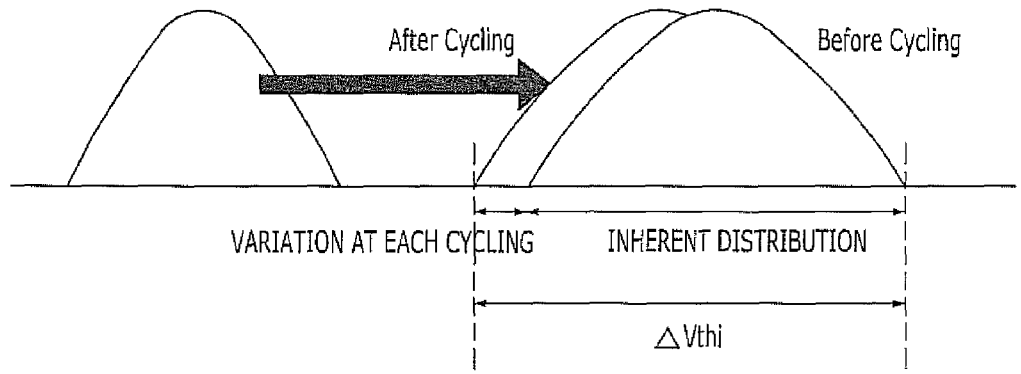
FIG. 5 is a view illustrating a variation in a program speed of a nonvolatile memory device according to program/erase cycle number.
Figure 6:
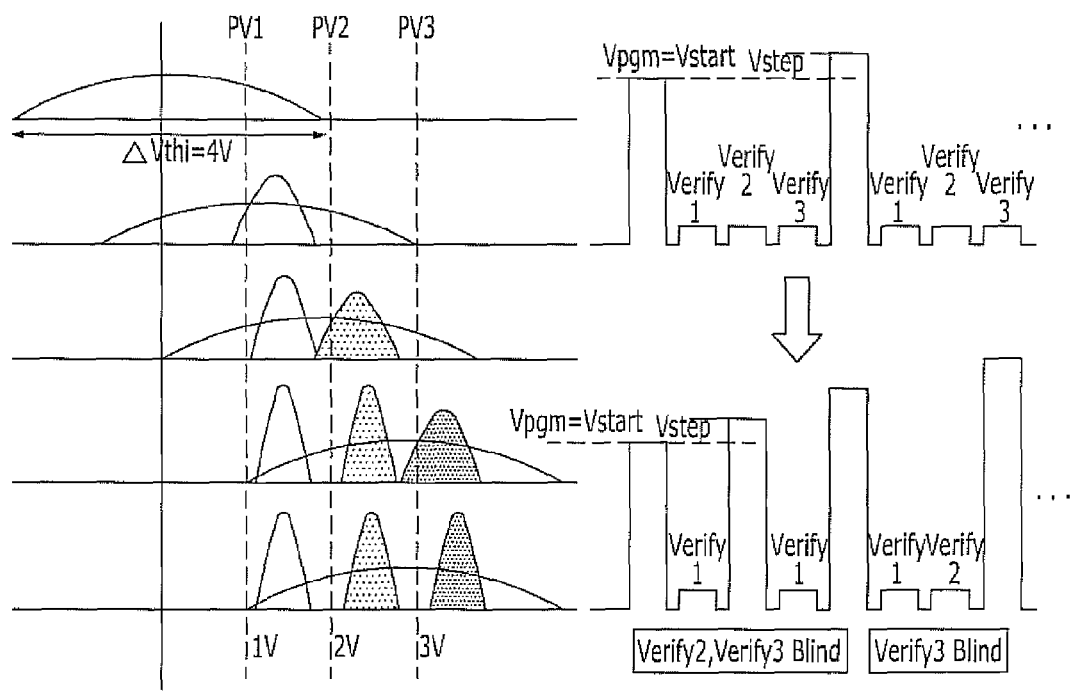
FIG. 6 is a view illustrating a blind verify method of a nonvolatile memory device.
Figure 7:
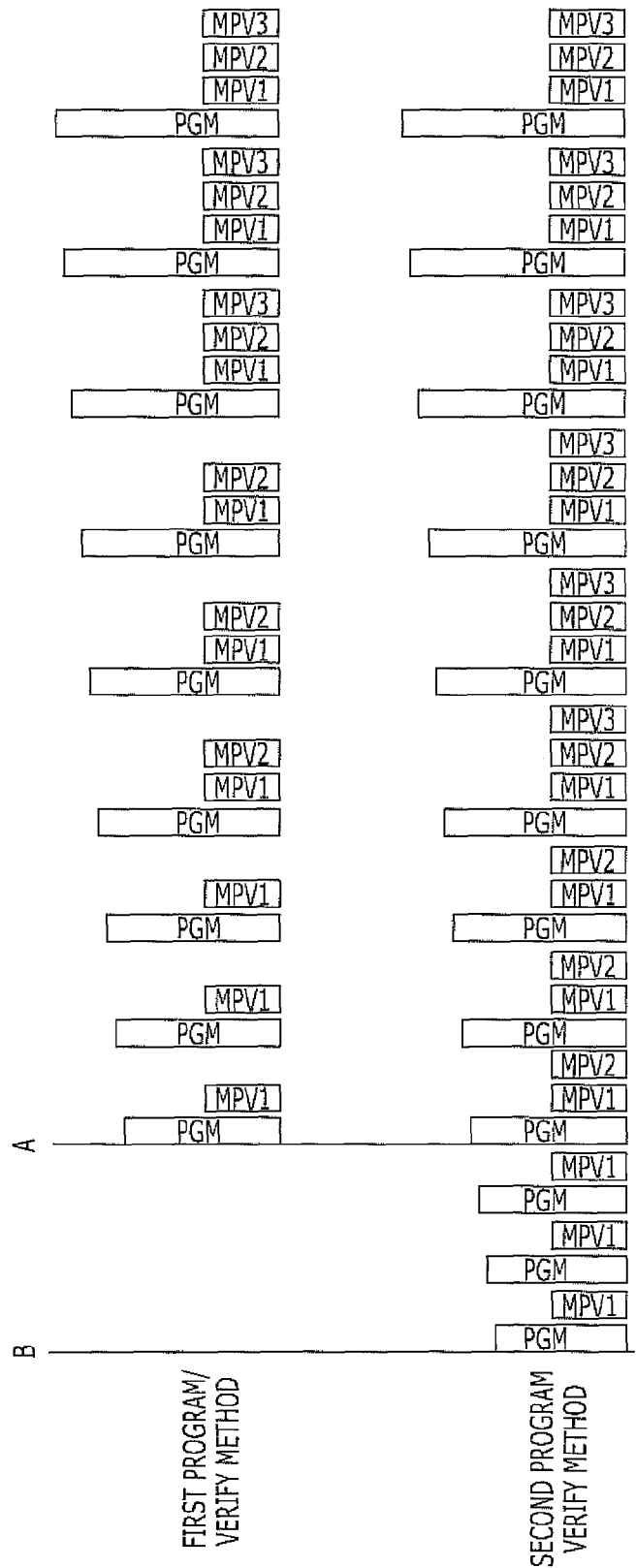
FIG. 7 is a view illustrating the concept of a conventional program/verify method with respect to an MSB program of a nonvolatile memory device.
Figure 8:
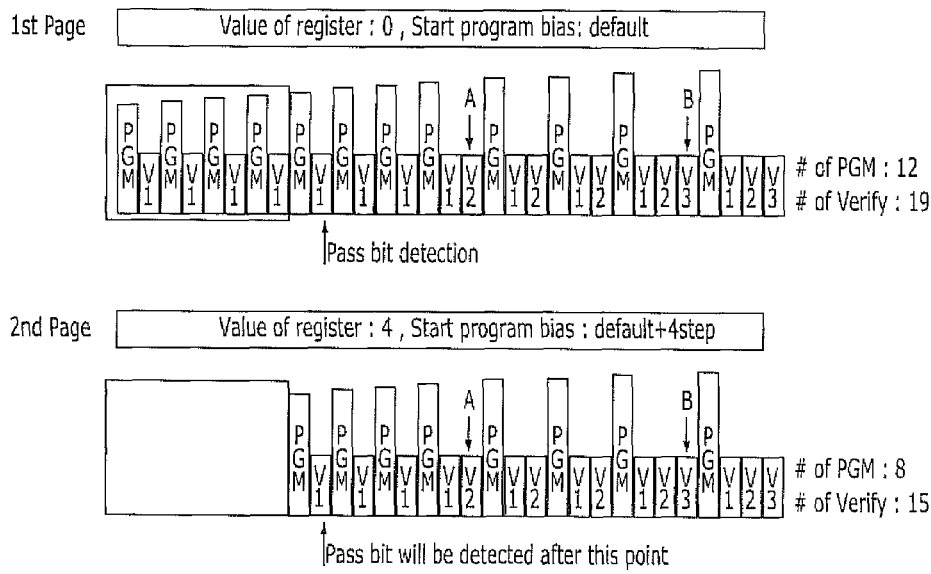
FIG. 8 is a view illustrating a conventional program/verify method of a nonvolatile memory device.

When power is supplied to the nonvolatile memory device (step 1100), an 'initialized first program start voltage' and an 'initialized second program start voltage' can be known in advance. As described above with reference to FIG. 2, the initialized first program start voltage and the initialized second program start voltage may be the program start voltage Vstart initially applied to the erased cells, where their default values may be adjusted according to various design needs. According to an example, the initialized first program start voltage and the initialized second program start voltage are constant voltages applied to the plurality of unit page regions 900<0:K>, 901<0:K>, . . . , where their default values may be adjusted to be equal to each other. According to another example, the default values of the initialized first program start voltage and the initialized second program start voltage may be adjusted to be different from each other.

The program operation to be performed is determined at step 1110. Here, it is determined whether to perform the first program operation or the second program operation. At this time, when the program operation is to be performed on the erased unit page regions 900<0:K>, 901<0:K>, . . . , the first program operation is performed. When the program operation is to be performed on the unit page regions 900<0:K>, 901<0:K>, . . . after the first program operation, the second program operation is performed. According to an example, the first program operation may include performing the LSB program operation on the erased cells, and the second program operation may include performing the MSB program operation thereon.

The first program operation is as follows. The initialized first program start voltage is supplied to the unit page regions 900<0:K>, 901<0:K>, . . . (step 1120), and it is determined whether or not 1 bit pass (that is, a detection of at least one programmed memory cell) is detected (step 1122). When the 1 bit pass is not detected, a program voltage corresponding to the sum of the initialized first program start voltage and a step voltage is supplied to the unit page regions 900<0:K>, 901<0:K>, . . . (step 1120), and it is again determined whether or not the 1 bit pass is detected (step 1122). When the 1 bit pass is not detected again, a program voltage corresponding to the sum of the initialized first program start voltage and a "step voltage*2" is again supplied to the unit page regions 900<0:K>, 901<0:K>, . . . (step 1120), and it is determined whether or not the 1 bit pass is detected (step 1122).

In each repetition of the operation 1120 of supplying the program voltage to the unit page regions 900<0:K>, 901<0:K>, . . . and the operation 1122 of determining whether or not the 1 bit pass is detected, the magnitude of the program voltage supplied to the unit page regions 900<0:K>, 901<0:K>, . . . is increased by a "step voltage*N" (where N is the number of repetitions). More specifically, the operation 1122 of determining whether or not the 1 bit pass is detected is repeatedly performed while performing the ISPP operation based on the "initialized first program start voltage".

When the 1 bit pass is detected while performing the operation 1120 of supplying the program voltage to the unit page regions 900<0:K>, 901<0:K>, . . . and the operation 1122 of determining whether or not the 1 bit pass is detected, the program pulse application count number (PD), where the program pulses are counted until the 1 bit pass is detected and the accumulated count upon the detection is outputted from the program pulse counting unit 950, is output to the auxiliary page buffering unit 910B of the unit page regions 900<0:K>, 901<0:K>, . . . from the program pulse application count storing unit 940 (step 1124), and the first program operation is performed (step 1126) to complete the program operation (step 1150).

As such, the program pulse application count storing unit 940 sets the auxiliary page buffering unit 910B with the program pulse application count number (PD), which is counted until the 1 bit pass is detected and is outputted from the program pulse counting unit 950, and the first program operation is completed. The program pulse application count number (PD), which is counted until the 1 bit pass is detected and is outputted from the program pulse counting unit 950, is stored in the plurality of auxiliary cells BL<M:N-1> corresponding to the auxiliary page buffering unit 910B.

In addition, since each of the plurality of unit page regions 900<0:K>, 901<0:K>, . . . includes the plurality of normal cells BL<0:M-1> and the plurality of auxiliary cells BL<M:N-1>, the program pulse application count number (PD), which is counted until the 1 bit pass is detected, is independently stored in the plurality of auxiliary cells BL<M:N-1> of the unit page regions 900<0:K>, 901<0:K>, . . . through the auxiliary page buffering unit 910B.

According to an example, the first program operation described above corresponds to the program pulse counting unit 950 and the program pulse application count storing unit 940 included in the controller of FIG. 9. Here, the circuit for performing the ISPP operation is a part of the controller of FIG. 9 although not illustrated explicitly.

Next, the second program operation will be described. After the completion of the first program operation, the second program operation is performed in the unit page regions in which the program pulse application count number (PD), which is counted until the first bit pass is detected, is stored in the plurality of auxiliary cells BL<M:N-1>. To this end, before the initialized second program start voltage is supplied, the program pulse application count number (PD), which is counted until the 1 bit pass is detected and stored in the plurality of auxiliary cells BL<M:N-1>, is read (step 1140).

Applying the read program pulse application count number (PD), which is counted until the 1 bit pass is detected, to the initialized second program start voltage is performed by the program start voltage setting unit 930 illustrated in FIG. 9. As to the application of the read program pulse application count number (PD), two exemplary cases as to how the program pulse application count number (PD) may be used are described below.

As for the first case, after the program pulse application count number (PD) stored in the plurality of auxiliary cells BL<M:N-1> is read, the product of the read program pulse application count number (PD) and the step voltage is added to the initialized second program start voltage. The resultant value is set as a new second program start voltage (step 1142).

As for the second case, the program pulse application count number (PD) stored in the plurality of auxiliary cells BL<M:N-1> is read and, in a case in which the read program pulse application count number (PD) is larger than a threshold value, a difference between the read program pulse application count number (PD) and the threshold value is multiplied by a step voltage, and a voltage corresponding to the resultant value of the multiplication is added to the initialized second program start voltage. The final value is set as a new second program start voltage (step 1142). However, in a case in which the read program pulse application count number (PD) is smaller than or equal to the threshold value, the initialized second program start voltage is set as the second program start voltage (step 1142). The threshold value may be selected according to different design needs such as characteristics of the cells. According to an example, when the read program pulse application count number (PD) is smaller than 2, it may be considered to be trivial. Thus, in such a case, 2 may be set as the threshold value.

As such, the second program operation is performed by receiving the new second program start voltage determined by the method of applying the read program pulse application count number (PD), which is counted until the 1 bit pass is detected, to the initialized second program start voltage. At this time, since the second program operation receives the new second program start voltage, the program operation can be completed at faster timing than the first program operation. According to an example, the second program operation also operates using the ISPP method.

In the LSB program operation when programming the unit page regions 900<0:K>, 901<0:K>, . . . as described above with reference to FIGS. 9 to 11, information used for finding the initial start voltage suitable for the characteristics of the unit page regions 900<0:K>, 901<0:K>, . . . , that is, the program pulse application count number (PD) counted until the 1 bit pass is detected, may be stored in the plurality of auxiliary cells. The information used for finding the initial start voltage suitable for the characteristics of the unit page regions 900<0:K>, 901<0:K>, . . . and stored in the plurality of auxiliary cells is used in the MSB program operation, thereby significantly reducing time for performing the MSB program operation.

In addition, the information used for finding the initial start voltage suitable for the characteristics of the unit page regions 900<0:K>, 901<0:K>, . . . and stored in the plurality of auxiliary cells are not erased even if power is not supplied to the nonvolatile memory device. Therefore, even if the power is interrupted after the LSM program operation and is supplied afterwards, the information is stored for use in the MSB program operation, thereby significantly reducing the time for performing the MSB program operation. Likewise, if the erase operation on the plurality of normal cells BL<0:M−1> inside the unit page regions 900<0:K>, 901<0:K>, . . . and the erase operation on the plurality of auxiliary cells BL<M:N−1> inside the unit page regions 900<0:K>, 901<0:K>, . . . can be controlled by using separate methods, the initial start voltage suitable for the characteristics of the plurality of unit page regions 900<0:K>, 901<0:K>, . . . can be found at the early stage of the nonvolatile memory device, stored in the plurality of auxiliary cells BL<M:N−1>, and applied to all subsequent program operations (e.g., including the remainder of the programming operations of the normal cells BL<0:M−1> after the detection). More specifically, regardless of whether the plurality of normal cells BL<0:M−1> and the plurality of auxiliary cells BL<M:N−1> are MLCs or SLCs, the above-described principle of adjusting an initial start voltage based on detected characteristics of the plurality of unit page regions 900<0:K>, 901<0:K>, according to an exemplary embodiment of the present invention can be applied to improving any subsequent program operation speed of the same or other memory cells or page regions.

Figure 12:
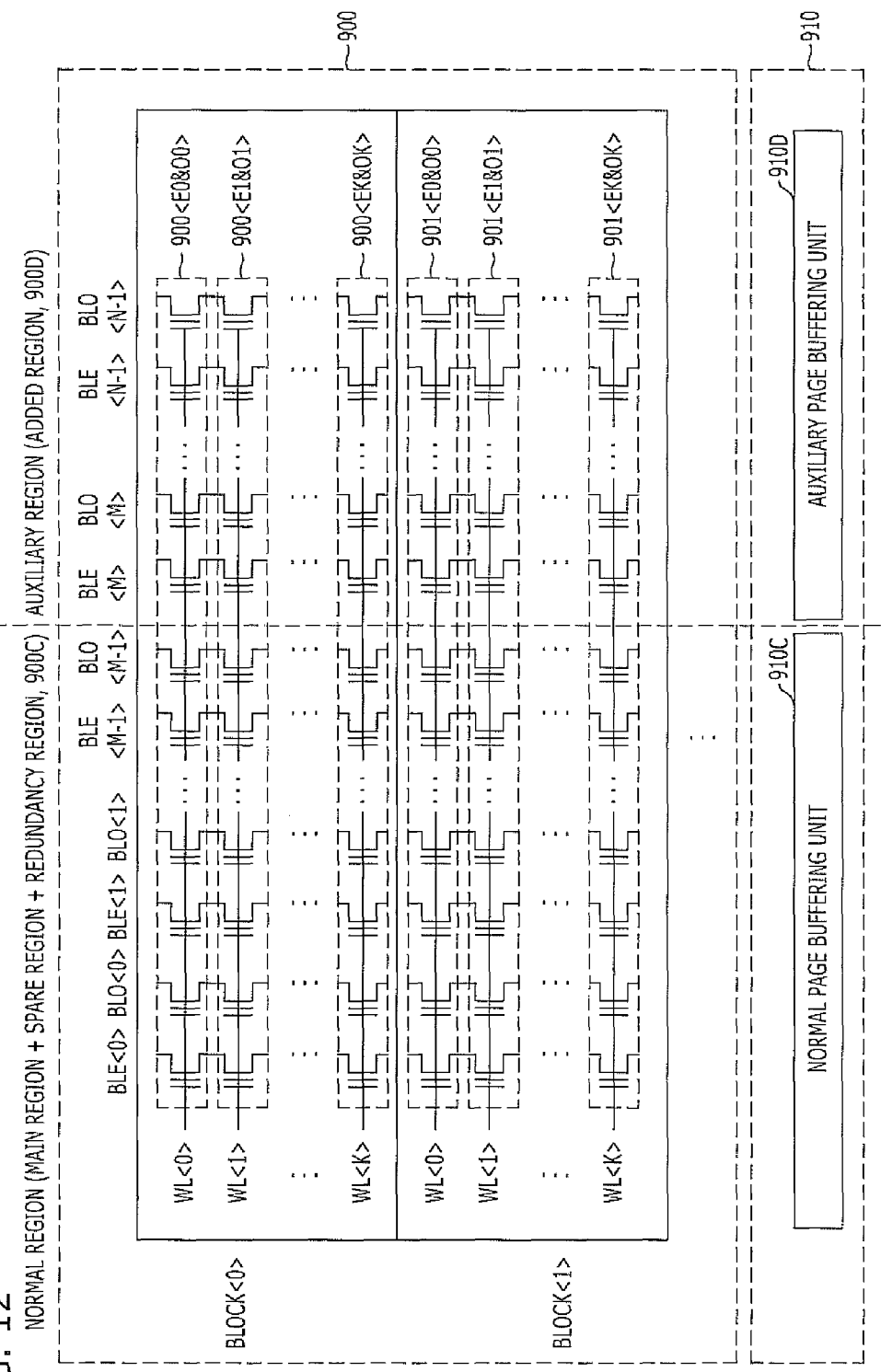
FIG. 12 is a detailed block diagram illustrating a second configuration of a memory cell array and a page buffering unit in the nonvolatile memory device of FIG. 9.

FIG. 12 is a detailed block diagram illustrating a second configuration of a memory cell array and a page buffering unit in the nonvolatile memory device of FIG. 9.

Here, as in the case of FIG. 10, FIG. 12 illustrates a detailed configuration of a memory cell array 900 and a page buffering unit 910 of the nonvolatile memory device of FIG. 9. However, since the detailed configuration of the memory cell array 900 illustrated in FIG. 12 is different from that of FIG. 10, an overall operation of the memory device of FIG. 9 may differ for the embodiments of the memory cell array 900 shown in FIGS. 10 and 12 as follows.

Referring to FIG. 12, the nonvolatile memory device in accordance with an exemplary embodiment of the present invention includes a memory cell array 900. The memory cell array 900 includes a normal region 900C and an auxiliary region 900D. Likewise, a page buffering unit 910 includes a normal page buffering unit 910C corresponding to the normal region 900C of the memory cell array 900 and an auxiliary page buffering unit 910D corresponding to the auxiliary region 900D.

The normal region 900C of the memory cell array 900 is a region including a main region, a spare region, and a redundancy region of the above-described nonvolatile memory device. On the other hand, the auxiliary region 900D of the memory cell array 900 is outside the normal region 900C. More specifically, the auxiliary region 900D of the memory cell array 900 is a region specially added to the nonvolatile memory device in accordance with an exemplary embodiment of the present invention. According to an example, the auxiliary region 900D may have a capacity for storing several bytes and may increase the entire size of the memory cell array 900. According to another example, a portion of the spare region or the redundancy region included in the above-described normal region 900C may be divided and set as the auxiliary region 900D instead of increasing the entire size of the memory cell array 900 by forming additional structure for the auxiliary region 900D.

Since the memory cell array 900 includes the normal region 900C and the auxiliary region 900D, first page regions 900<E0:EK>, 901<E0:EK>, . . . for even memory cells and second page regions 900<O0:OK>, 901<O0:OK>, . . . for odd memory cells provided in the memory cell array 900 are configured to include a plurality of normal cells BLE<0:M−1> and BLO<0:M−1> and a plurality of auxiliary cells BLE<M:N−1> and BLO<M:N−1>. The first page regions 900<E0:EK>, 901<E0:EK>, . . . and the second page regions 900<O0:OK>, 901<O0:OK>, . . . include a plurality of cells and share word lines WL<0:K>. More specifically, the first page regions 900<E0:EK>, 901<E0:EK>, . . . sharing the word lines WL<0:K> include the plurality of normal cells BLE<0:M−1> and the plurality of auxiliary cells BLE<M:N−1>, and the second page regions 900<O0:OK>, 901<O0:OK>, . . . include the plurality of normal cells BLO<0:M−1> and the plurality of auxiliary cells BLO<M:N−1>.

According to an example, since the first page regions 900<E0:EK>, 901<E0:EK>, and the second page regions 900<O0:OK>, 901<O0:OK>, . . . share the word lines WL<0:K>, the plurality of normal cells BLE<0:M−1> and the plurality of auxiliary cells BLE<M:N−1>, which are included in the first page regions 900<E0:EK>, 901<E0:EK>, . . . , and the plurality of normal cells BLO<0:M−1> and the plurality of auxiliary cells BLO<M:N−1>, which are included in the second page regions 900<O0:OK>, 901<O0:OK>, . . . , are alternately arranged as illustrated in FIG. 12. According to an example, the above arrangement is implemented by having the area occupied by the memory cell array string to be smaller than the area occupied by the page buffer. Here, the first page regions 900<E0:EK>, 901<E0:EK>, . . . and the second page regions 900<O0:OK>, 901<O0:OK>, . . . may operate completely independently from each other except that they share the word lines WL<0:K>.

The nonvolatile memory device in accordance with an exemplary embodiment of the present invention includes a bit pass detecting unit 920, a program pulse application count storing unit 940, and a program start voltage setting unit 930. The bit pass detecting unit 920 outputs a 1 bit pass signal 1BIT_PASS when at least one cell is programmed with a voltage higher than a reference voltage among program target cells of the first page regions 900<E0:EK>, 901<E0:EK>, . . . . The program pulse application count storing unit 940 stores the program pulse application count number, where the program pulse is repeatedly applied until the 1 bit pass signal 1BIT_PASS is outputted during the program operation on the first page regions 900<E0:EK>, 901<E0:EK>, . . . , in the plurality of auxiliary cells BLE<M:N−1> of the first page regions 900<E0:EK>, 901<E0:EK>, . . . . The program start voltage setting unit 930 sets the program start voltage for the program operation of the first page regions 900<E0:EK>, 901<E0:EK>, . . . , and/or the second page regions 900<O0:OK>, 901<O0:OK>, . . . , based on the program pulse application count number stored in the plurality of auxiliary cells BLE<M:N−1> of the first page regions 900<E0:EK>, 901<E0:EK>, . . . .

In addition, the nonvolatile memory device in accordance with an exemplary embodiment of the present invention further includes a program pulse counting unit 950. The program pulse counting unit 950 counts the program pulse application count number applied to the first page regions 900<E0:EK>, 901<E0:EK>, . . . until the 1 bit pass signal 1BIT_PASS is outputted during the program operation on the first page regions 900<E0:EK>, 901<E0:EK>, . . . , and transfers the counted number of the program pulse applications to the program pulse application count storing unit 940.

The plurality of cells provided in the memory cell array 900 may be multi level cells (MLCs) or single level cells (SLCs). More specifically, the plurality of normal cells BLE<0:M−1> and the plurality of auxiliary cells BLE<M:N−1>, which are included in the first page regions 900<E0:EK>, 901<E0:EK>, . . . , and the plurality of normal cells BLO<0:M−1> and the plurality of auxiliary cells BLO<M:N−1>, which are included in the second page regions 900<O0:EK>, 901<O0:EK>, . . . , may be SLCs or MLCs. Although the operations may be slightly different depending on whether the plurality of cells provided in the memory cell array 900 are SLCs or MLCs, exemplary operations thereof are described with respect to the flowchart in FIG. 11.

For illustration purposes, a case in which the plurality of cells provided in the memory cell array 900 of the nonvolatile memory device in accordance with an exemplary embodiment of the present invention are SLCs are first described below with reference to FIG. 11.

It is illustrated that when power is supplied to the nonvolatile memory device (step 1100), an 'initialized first program start voltage' and an 'initialized second program start voltage' are provided. However, since the plurality of cells included in the first page regions 900<E0:EK>, 901<E0:EK>, . . . and the second page regions 900<O0:OK>, 901<O0:OK> illustrated in FIG. 12 are SLCs, two separate program operations used, for example, in MLCs, is not performed on a memory cell. Therefore, the initialized first program start voltage in FIG. 11 is replaced with the initialized program start voltage of the first page region, and the initialized second program start voltage in FIG. 11 is replaced with the initialized program start voltage of the second page region. At this time, as described above with reference to FIG. 2, the initialized program start voltage of the first page region and the initialized program start voltage of the second page region correspond to the program start voltage Vstart initially applied to the erased cells in FIG. 11, and their default values may be adjusted according to various design needs. According to an example, the initialized program start voltage of the first page region and the initialized program start voltage of the second page region are constant voltages applied to the plurality of first page regions 900<E0:EK>, 901<E0:EK>, . . . , and the plurality of second page regions 900<O0:OK>, 901<O0:OK>, where their default values may be adjusted to be equal to each other. According to another example, the default values of the initialized program start voltage of the first page region and the initialized program start voltage of the second page region may be adjusted to be different from each other.

The program operation to be performed is determined (step 1110). Here, it is determined whether to perform the first program operation or the second program operation. At this time, since the plurality of cells included in the first page regions 900<E0:EK>, 901<E0:EK>, . . . and the second page regions 900<O0:OK>, 901<O0:OK>, . . . are all the SLCs, the first program illustrated in FIG. 11 may correspond to the program operation of the first page regions 900<E0:EK>, 901<E0:EK>, . . . , and the second program illustrated in FIG. 11 may correspond to the program operation of the second page regions 900<O0:OK>, 901<O0:OK> . . . . While separate first and second programs have been discussed above, as a whole, the program operation on any unit cell in the nonvolatile memory device having SLCs may be performed just one time.

The program operation on the first page regions 900<E0:EK>, 901<E0:EK>, . . . , which corresponds to the first program operation, will be described below. The initialized program start voltage of the first page region is supplied to the first page regions 900<E0:EK>, 901<E0:EK>, . . . (step 1120), and it is determined whether or not 1 bit pass (that is, a detection of at least one programmed memory cell) is detected in the first page regions 900<E0:EK>, 901<E0:EK>, . . . (step 1122). When the 1 bit pass is not detected in the first page regions 900<E0:EK>, 901<E0:EK>, . . . , a voltage corresponding to the sum of the initialized program start voltage of the first page region and a step voltage is supplied to the first page regions 900<E0:EK>, 901<E0:EK>, . . . (step 1120), and it is again determined whether or not the 1 bit pass is detected (step 1122). When the 1 bit pass is not detected again, a program voltage corresponding to the sum of the initialized program start voltage of the first page region and a "step voltage*2" is again supplied to the first page regions 900<E0:EK>, 901<E0:EK>, . . . (step 1120), and it is determined whether or not the 1 bit pass is detected (step 1122).

In each repetition of the operation 1120 of supplying the program voltage to the first page regions 900<E0:EK>, 901<E0:EK>, . . . and the operation 1122 of determining whether or not the 1 bit pass is detected, the magnitude of the program voltage supplied to the first page regions 900<E0:EK>, 901<E0:EK>, . . . is increased by a "step voltage*N" (where N is the number of repetitions). More specifically, the operation 1122 of determining whether or not the 1 bit pass is detected is repeatedly performed while performing the ISPP operation based on the "initialized program start voltage of the first page region".

When the 1 bit pass is detected while performing the operation 1120 of supplying the program voltage to the first page regions 900<E0:EK>, 901<E0:EK>, . . . and the operation 1122 of determining whether or not the 1 bit pass is detected, the program pulse application count number (PD), where the program pulses are counted until the 1 bit pass is detected and the accumulated count upon the detection is outputted from the program pulse counting unit 950, is output to the auxiliary page buffering unit 910D of the first page regions 900<E0:EK>, 901<E0:EK>, . . . from the program pulse application count storing unit 940 (step 1124), and the first program operation is performed (step 1126) to complete the program operation (step 1150).

As such, the program pulse application count storing unit 940 sets the auxiliary page buffering unit 910D with the program pulse application count number (PD), which is counted until the 1 bit pass is detected and is outputted from the program pulse counting unit 950, and the first program operation is completed. The program pulse application count number (PD), which is counted until the 1 bit pass is detected and is outputted from the program pulse counting unit 950, is stored in the plurality of auxiliary cells BLE<M:N−1> corresponding to the auxiliary page buffering unit 910D.

In addition, since each of the plurality of first page regions 900<E0:EK>, 901<E0:EK>, . . . includes the plurality of normal cells BLE<0:M−1> and the plurality of auxiliary cells BLE<M:N−1>, the program pulse application count number (PD), which is counted until the 1 bit pass is detected, which corresponds to the first page regions 900<E0:EK>, 910<E0:EK>, . . . , is independently stored in the plurality of auxiliary cells BLE<M:N−1> of the first page regions 900<E0:EK>, 901<E0:EK>, . . . through the auxiliary page buffering unit 910D.

According to an example, the above-described program operation of the first page regions corresponds to the program pulse counting unit 950 and the program pulse application count storing unit 940 included in the controller of FIG. 9. Here, the circuit for performing the ISPP operation is a part of the controller of FIG. 9 although not explicitly illustrated.

Next, the second program operation will be described. After the completion of the first program operation of the first page regions 900<E0:EK>, 901<E0:EK>, . . . , the program operation is performed on the second page regions 900<O0:OK>, 901<O0:OK>, . . . based on the program pulse application count number (PD), which is counted until the first bit pass is detected and is stored in the plurality of auxiliary cells BLE<M:N−1> of the first page regions 900<E0:EK>, 901<E0:EK>, . . . . To this end, before the initialized program start voltage of the second page region is supplied, the program pulse application count number (PD), which is counted until the 1 bit pass is detected and stored in the plurality of auxiliary cells BLE<M:N−1> of the first page regions 900<E0:EK>, 901<E0:EK>, . . . is read (step 1140).

Applying the read program pulse application count number (PD), which is counted until the 1 bit pass is detected, to the initialized program start voltage of the second page region is performed by the program start voltage setting unit 930 illustrated in FIG. 9. As to the application of the read program pulse application count number (PD), two exemplary cases as to how the program pulse application count number (PD) may be used are described below.

As for the first case, after the program pulse application count number (PD) stored in the plurality of auxiliary cells BLE<M:N−1> of the first page regions 900<E0:EK>, 901<E0:EK> is read, the product of the red program pulse application count number (PD) and the step voltage is added to the initialized program start voltage of the second page region. The resultant value is set as a new program start voltage of the second page region (step 1142).

As for the second case, the program pulse application count number (PD) stored in the plurality of auxiliary cells BLE<M:N−1> of the first page regions 900<E0:EK>, 901<E0:EK>, . . . is read and, in a case in which the read program pulse application count number (PD) is larger than a threshold value, a difference between the read program pulse application count number (PD) and the threshold value is multiplied by a step voltage, and a voltage corresponding to the resultant value of the multiplication is added to the initialized program start voltage of the second page region. The final value is set as a new program start voltage of the second page region (step 1142). However, in a case in which the read program pulse application count number (PD) is smaller than or equal to the threshold value, the initialized program start voltage of the second page region is set as the program start voltage of the second page region (step 1142). The threshold value may be selected according to different design needs such as characteristics of the cells. According to an example, when the read program pulse application count number (PD) is smaller than 2, it may be considered to be trivial. Thus, in such a case, 2 may be set as the threshold value.

As such, the program operation of the second page region is performed by receiving the new program start voltage of the second page region determined by the method of applying the read program pulse application count number (PD), which is counted until the 1 bit pass is detected, to the initialized program start voltage of the second page region. At this time, since the program operation of the second page region receives the new program start voltage of the second page region, the program operation can be completed at faster timing than the program operation of the first page region. According to an example, the program operation of the second page region also operates using the ISPP method.

In the operation of programming the first page regions 900<E0:EK>, 901<E0:EK>, . . . as described above with reference to FIGS. 9, 11 and 12, information used for finding the initial start voltage suitable for the characteristics of the first page regions 900<E0:EK>, 901<E0:EK>, . . . , that is, the program pulse application count number (PD) counted until the 1 bit pass is detected, may be stored in the plurality of auxiliary cells included in the first page regions 900<E0:EK>, 901<E0:EK>, . . . . At this time, since the first page regions 900<E0:EK>, 901<E0:EK>, . . . and the second page regions 900<O0:OK>, 901<O0:OK>, . . . share the word lines WL<0:K>, the initial start voltage suitable for the characteristics of the first page regions 900<E0:EK>, 901<E0:EK>, . . . can be the initial start voltage suitable for the characteristics of the second page regions 900<O0:OK>, 901<O0:OK>, . . . . Therefore, the information used for finding the initial start voltage suitable for the characteristics of the first page regions 900<E0:EK>, 901<E0:EK>, . . . and stored in the plurality of auxiliary cells of the first page regions 900<E0:EK>, 901<E0:EK>, . . . is used in the program operation of the second page regions 900<O0:OK>, 901<O0:OK>, . . . , thereby significantly reducing time for performing the program operation of the second page regions 900<O0:OK>, 901<O0:OK>, . . . .

In addition, the information used for finding the initial start voltage suitable for the characteristics of the first page regions 900<E0:EK>, 901<E0:EK>, . . . and stored in the plurality of auxiliary cells of the first page regions 900<E0:EK>, 901<E0:EK>, . . . are not erased even though power is not supplied to the nonvolatile memory device. Therefore, even if the power is interrupted after the program operation of the first page regions 900<E0:EK>, 901<E0:EK>, . . . and is supplied afterwards, the information is stored for use in the program operation of the second page regions 900<O0:OK>, 901<O0:OK>, . . . , thereby significantly reducing the time for performing the program operation of the second page regions 900<O0:OK>, 901<O0:OK>, . . . .

Next, the case in which the plurality of cells provided in the memory cell array 900 of the nonvolatile memory device in accordance with an exemplary embodiment of the present invention are MLCs are described below with reference to FIG. 11.

It is illustrated that when power is supplied to the nonvolatile memory device at step 1100, the 'initialized first program start voltage' and the 'initialized second program start voltage' are provided. However, since the memory cell array 900 illustrated in FIG. 12 includes the first page regions 900<E0:EK>, 901<E0:EK>, . . . and the second page regions 900<O0:OK>, 901<O0:OK>, . . . and the plurality of cells included in the first page regions 900<E0:EK>, 901<E0:EK>, . . . and the second page regions 900<O0:OK>, 901<O0:OK>, . . . may be all MLCs, the program start voltage is not simply divided into the initialized first program start voltage and the initialized second program start voltage. Rather, the initialized first program start voltage correspond to the initialized first program start voltage of the first page region and the initialized second program start voltage of the first page region, and the initialized second program start voltage correspond to the initialized first program start voltage of the second page region and the initialized second program start voltage of the second page region. At this time, as described above with reference to FIG. 2, the initialized first program start voltage of the first page region, the initialized second program start voltage of the first page region, the initialized first program start voltage of the second page region, and the initialized second program start voltage of the second page region correspond to the program start voltage Vstart initially applied to the erased cells, where their default values may be adjusted according to various design needs. According to an example, the initialized first program start voltage of the first page region, the initialized second program start voltage of the first page region, the initialized first program start voltage of the second page region, and the initialized second program start voltage of the second page region are constant voltages applied to the first page regions 900<E0:EK>, 901<E0:EK>, . . . , and the second page regions 900<O0:OK>, 901<O0:OK>, where their default values may be adjusted to be equal to each other. According to another example, the defaults values of the initialized first program start voltage of the first page region, the initialized second program start voltage of the first page region, the initialized first program start voltage of the second page region, and the initialized second program start voltage of the second page region may be adjusted to be different from each other.

The program operation to be performed is determined (step 1110). Here, it is determined whether to perform the first program operation or the second program operation. At this time, since the plurality of cells included in the first page regions 900<E0:EK>, 901<E0:EK>, . . . and the second page regions 900<O0:OK>, 901<O0:OK>, . . . are all the MLCs, the first program and the second program illustrated in FIG. 11 may correspond to the program operations of the first page regions 900<E0:EK>, 901<E0:EK>, . . . , and the second page regions 900<O0:OK>, 901<O0:OK> . . . . Here, the LSB program operation is performed on a unit cell in the nonvolatile memory device having MLCs and the MSB program operation is subsequently performed thereon.

A different operation is added here because the plurality of cells provided in the memory cell array of the nonvolatile memory device in accordance with an exemplary embodiment of the present invention are the MLCs and includes the first page regions 900<E0:EK>, 901<E0:EK>, . . . and the second page regions 900<O0:OK>, 901<O0:OK>, . . . sharing the word lines WL<0:K>.

For example, when the first program operation of the first pages 900<E0:EK>, 901<E0:EK>, . . . is performed, the first program operation illustrated in FIG. 11 is performed. Since the first program operation has been described above in detail, further description thereof will be omitted.

During the first program operation, the program pulse application count number (PD), which counted until the 1 bit pass is detected, is stored in the auxiliary cells BLE<M:N-1> of the first page regions 900<E0:EK>, 901<E0:EK>, . . . .

When the second program operation of the first pages 900<E0:EK>, 901<E0:EK>, . . . is performed, the second program operation illustrated in FIG. 11 is performed. Since the second program operation has been described above in detail, further description thereof will be omitted.

The second program operation of the first page regions 900<E0:EK>, 901<E0:EK>, . . . can be performed using the information used for finding the initial start voltage suitable for the characteristics of the first page regions 900<E0:EK>, 901<E0:EK>, and stored in the plurality of auxiliary cells BLE<M:N-1> of the first page regions 900<E0:EK>, 901<E0:EK>, . . . , thereby significantly reducing time for performing the second program operation of the first page regions 900<E0:EK>, 901<E0:EK>, . . . .

When the first program operation of the second page regions 900<O0:OK>, 901<O0:OK>, . . . is to be performed, the second program operation may be performed instead of the first program operation illustrated in FIG. 11. This is because the first page regions 900<E0:EK>, 901<E0:EK>, . . . and the second page regions 900<O0:OK>, 901<O0:OK>, . . . share the word lines WL<0:K> and the initial start voltage suitable for the characteristics of the first page regions 900<E0:EK>, 901<E0:EK>, . . . can be considered as the initial start voltage suitable for the characteristics of the second page regions 900<O0:OK>, 901<O0:OK>, . . . . Thus, according to an example, since the first program operation of the first page regions 900<E0:EK>, 901<E0:EK>, . . . is performed in the same manner as the first program operation of FIG. 11, information used for finding the initial start voltage suitable for the characteristics of the first page regions 900<E0:EK>, 901<E0:EK>, . . . stored in the plurality of auxiliary cells BLE<M:N-1> of the first page regions 900<E0:EK>, 901<E0:EK>, . . . can be applied to the program operation of the second page regions 900<O0:OK>, 901<O0:OK>, . . . . Therefore, by optionally skipping obtaining separate information used for finding the initial start voltage suitable for the characteristics of the second page regions 900<O0:OK>, 901<O0:OK> and performing the program operations of the second page regions 900<O0:OK>, 901<O0:OK>, . . . and using the information used for finding the initial start voltage suitable for the characteristics of the first page regions 900<E0:EK>, 901<E0:EK>, . . . stored in the plurality of auxiliary cells BLE<M:N-1> of the first page regions 900<E0:EK> in determining the initial start voltage suitable for the characteristics of the second page regions 900<O0:OK>, 901<O0:OK>, the time for performing the first and second program operations of the second page regions 900<O0:OK>, 901<O0:OK>, . . . can be significantly reduced.

In addition, the information used for finding the initial start voltage suitable for the characteristics of the first page regions 900<E0:EK>, 901<E0:EK>, . . . and stored in the plurality of auxiliary cells BLE<M:N-1> of the first page regions 900<E0:EK>, 901<E0:EK>, . . . are not erased even if power is not supplied to the nonvolatile memory device. Therefore, even if the power is interrupted after the first program operation of the first page regions 900<E0:EK>, 901<E0:EK>, . . . and is supplied afterwards, the information is stored and used in the second program operations of the first page regions 900<E0:EK>, 901<E0:EK>, . . . , and at least the first program operation of the second page regions 900<O0:OK>, 901<O0:OK>, . . . , thereby significantly reducing the time for performing the second program operation of the first page regions 900<E0:EK>, 901<E0:EK>, . . . , and the first program operation of the second page regions 900<O0:OK>, 901<O0:OK>, . . . .

Figure 13:
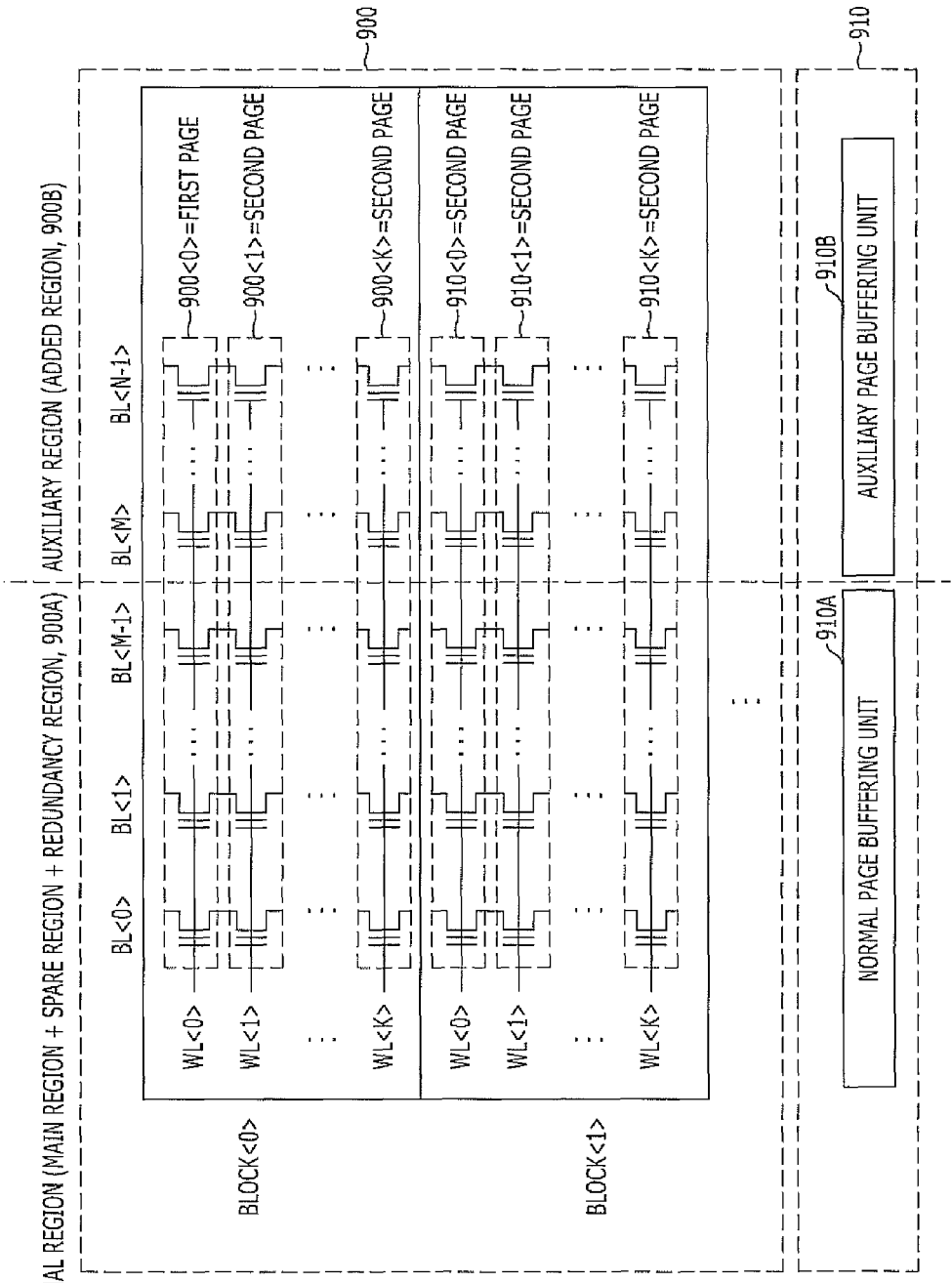
FIG. 13 is a detailed block diagram illustrating a third configuration of a memory cell array and a page buffering unit in the nonvolatile memory device of FIG. 9.

FIG. 13 is a detailed block diagram illustrating a third configuration of a memory cell array and a page buffering unit in the nonvolatile memory device of FIG. 9.

According to an example, since the above-described configuration of FIG. 10 is for a state where the unit page regions 900<0:K>, 901<0:K>, . . . are independent, its operations with respect to FIG. 10 have been described by assuming that the program operation is performed in one page region group.

However, if operations on the unit page regions 900<0:K>, 901<0:K>, . . . illustrated in FIG. 10 are performed for two or more page region groups, the configuration of FIG. 10 may be shown as in FIG. 13.

Referring to FIG. 13, a memory cell array 900 includes a first page region 900<0> (that is, the first page region group) and second page regions 900<1:K>, 901<0:K>, . . . including a plurality of normal cells BL<0:M-1> and a plurality of auxiliary cells BL<M:N-1> (that is, the second page region group) and sharing strings. More specifically, when one page region 900<0> among the plurality of unit page regions 900<0:K>, 901<0:K>, . . . included in the memory cell array 900 is set as the first page region group, the remaining page regions 900<1:K>, 901<0:K>, . . . may be set as the second page region group.

The configuration of FIG. 13 is substantially identical to the configuration of FIG. 10, except that the plurality of unit page regions 900<0:K>, 901<0:K>, . . . are divided into the first page region 900<0> and the second page regions 900<1:K>, 901<0:K>, . . . .

Specifically, when assuming that the plurality of cells included in the memory cell array 900 are SLCs, the nonvolatile memory device illustrated in FIG. 13 includes a bit pass detecting unit 920, a program pulse application count storing unit 940, and a program start voltage setting unit 930. The bit pass detecting unit 920 outputs a 1 bit pass signal 1BIT_PASS when at least one cell is programmed with a voltage higher than a reference voltage among program target cells of the first page region 900<0>. The program pulse application count storing unit 940 stores the program pulse application count number, where the program pulse is repeatedly applied until the 1 bit pass signal 1BIT_PASS is outputted during the program operation on the first page region 900<0>, in the plurality of auxiliary cells BL<M:N−1> of the first page region 900<0>. The program start voltage setting unit 930 sets the program start voltage for the program operation of the second page regions 900<1:K>, 901<0:K>, . . . , based on the program pulse application count number stored in the plurality of auxiliary cells BL<M:N−1> of the first page region 900<0>.

In addition, the nonvolatile memory device in accordance with an exemplary embodiment of the present invention further includes a program pulse counting unit 950. The program pulse counting unit 950 counts the program pulse application count number applied to the first page region 900<0> until the 1 bit pass signal 1BIT_PASS is outputted during the program operation on the first page region 900<0>, and transfers the counted number of the program pulse applications to the program pulse application count storing unit 940.

When the plurality of cells included in the memory cell array 900 are MLCs, the nonvolatile memory device illustrated in FIG. 13 includes a bit pass detecting unit 920, first program start voltage adjusting units 930, 940 and 950, and second program start voltage adjusting units 930, 940, 950 and 910 (for example, same start voltage adjusting units 930, 940, 950 and 910 are used for both the first and second program start voltage adjusting units). The bit pass detecting unit 920 outputs a 1 bit pass signal 1BIT_PASS when at least one cell is programmed with a voltage higher than a reference voltage among program target cells of the first page region 900<0> or the second page regions 900<1:K>, 901<0:K>, . . . . The first program start voltage adjusting units 930, 940 and 950 store the program pulse application count number, where the program pulse is repeatedly applied until the 1 bit pass signal 1BIT_PASS is outputted during the first program operation of the first page region 900<0> to which the first program start voltage is applied, in the plurality of auxiliary cells BL<M:N−1> of the first page region 900<0>, and apply it to the second program operation of the first page regions 900<0> by adjusting the first program start voltage according to the stored program pulse application count number. The second program start voltage adjusting units 930, 940, 950 and 910 store the program pulse application count number, which is applied until the 1 bit pass signal 1BIT_PASS is outputted during the first program operation of the second page regions 900<1:K>, 901<0:K>, . . . to which a program start voltage is selected and applied, in the plurality of auxiliary cells BL<M:N−1> of the second page regions 900<1:K>, 901<0:K>, . . . , and apply it to the second program operation of the second page regions 900<1:K>, 901<0:K>, . . . by adjusting the second program start voltage according to the stored program pulse application count number.

According to an example, the first program start voltage adjusting units 930, 940 and 950 and the second program start voltage adjusting units 930, 940, 950 and 910 may overlap and the same elements may be used as common elements for both the first program start voltage adjusting units. Here, the configuration of FIG. 9 has been illustrated with different page region groups with different operations as described above even both figures have the same elements.

The first program start voltage adjusting units 930, 940 and 950 are the same elements as the program pulse application count storing unit 940, the program start voltage setting unit 930, and the program pulse counting unit 950 illustrated in FIG. 9. More specifically, the nonvolatile memory device includes a first program pulse application count storing unit 940, a first program start voltage setting unit 930, and a program pulse counting unit 950. The first program pulse application count storing unit 940 stores the program pulse application count number, where the program pulse is repeatedly applied until the 1 bit pass signal 1BIT_PASS is outputted in the first program operation of the first page region 900<0> to which the first program start voltage is applied, in the plurality of auxiliary cells BL<M:N−1> of the first page region 900<0>. The first program start voltage setting unit 930 sets the first program start voltage according to the program pulse application count number stored in the plurality of auxiliary cells BL<M:N−1> of the first page region 900<0>, and applies it to the second program operation on the first page region 900<0>. The program pulse counting unit 950 counts the program pulse application count number outputted in the first program operation on the first page region 900<0> and transfers the counted number of the program pulse applications to the first program pulse application count storing unit 940.

Therefore, using the operation of the first program start voltage adjusting units 930, 940 and 950, the first program operation and the second program operation illustrated in FIG. 11 can be performed.

Figure 14:
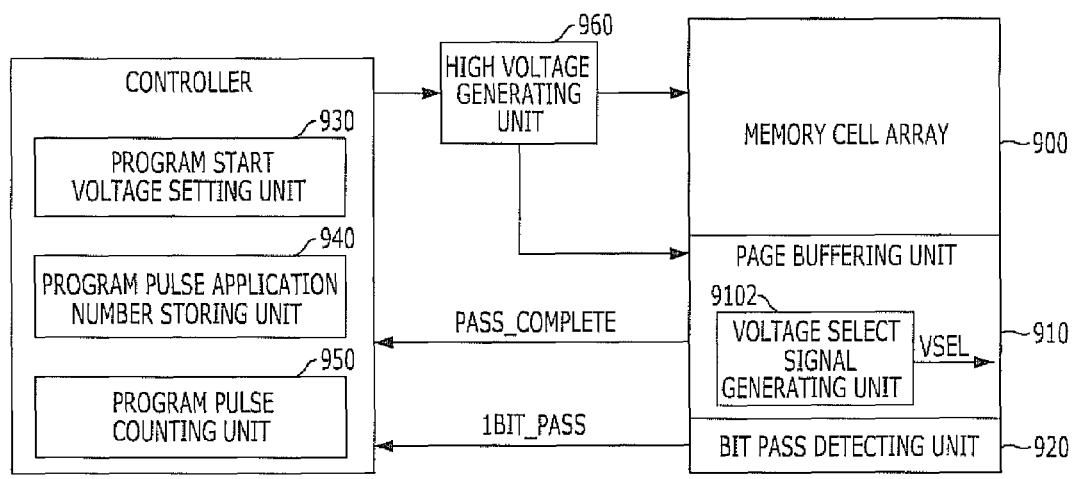
FIG. 14 is a block diagram illustrating the nonvolatile memory device of FIG. 9 in which a voltage select signal generating unit is further included.

However, operations of the second program start voltage adjusting units 930, 940, 950 and 910 are different from operations of the first program start voltage adjusting units 930, 940 and 950 in that operations of the second program start voltage adjusting units 930, 940, 950 and 910 include an operation of selecting the program start voltage applied to the first program operation of the second page regions 900<1:K>, 901<0:K>, . . . as the first program start voltage. Due to such a difference in operations, the second program start voltage adjusting units 930, 940, 950 and 910 include the program pulse application count storing unit 940, the program start voltage setting unit 930, and the program pulse counting unit 950 illustrated in FIG. 9, and further include the voltage select signal generating unit 9102 of the page buffering unit 910 as shown in FIG. 14.

Therefore, the second program start voltage adjusting units 930, 940, 950 and 910 include the voltage select signal generating unit 9102, the second program pulse application count storing unit 940, the second program start voltage setting unit 930, and the second program pulse counting unit 950. The voltage select signal generating unit 9102 compares the program pulse application count number stored in the plurality of auxiliary regions 900D of the first page region 900<0> with the threshold value and generates a voltage select signal VSEL based on the comparison. In the first program operation of the second page regions 900<1:K>, 901<0:K>, . . . to which a program start voltage is selected and applied according to the voltage select signal VSEL, the second program pulse application count storing unit 940 stores the program pulse application count number in the plurality of auxiliary regions 900D of the second page regions 900<1:K>, 901<0: K>, . . . . The second program start voltage setting unit 930 adjusts (or do not adjust) the program start voltage for the second page regions 900<1:K>, 901<0:K>, . . . according to the program pulse application count number stored in the plurality of auxiliary regions 900D of the second page regions 900<1:K>, 901<0:K>, . . . and applies the adjusted or unadjusted program start voltage to the second program operation on the second page regions 900<1:K>, 901<0:K>, . . . . The second program pulse counting unit 950 counts the program pulse application count number outputted in the first program operation on the second page regions 900<1:K>, 901 <0:K>, . . . , and transfers the counted number of the program pulse applications to the second program pulse application count storing unit 940.

Since the operation of the second program start voltage adjusting units 930, 940, 950 and 910 for the second page regions is different from the operation of the first program start voltage adjusting units 930 for the first page region, the first program operation and the second program operation illustrated in FIG. 11 are not directly applicable. Therefore, slightly modified first program operation and second program operation from the first program operation and the second program operation illustrated in FIG. 11 are applied as the first and second program operations in FIG. 15.

The program operation of the nonvolatile memory device in accordance with an exemplary embodiment of the present invention is described in detail with reference to FIG. 15.

When power is supplied (that is, not powered off or powered back on after a power-off) to the nonvolatile memory device at step 1500 after the first and second program steps in FIG. 11 are performed, the initialized first program start voltage and the initialized second program start voltage are provided. Operations are explained by assuming that the operation steps of FIG. 15 are applied to the unit page regions 900<0:K>, 901<0:K>, . . . . On the other hand, in the second program start voltage adjusting units 930, 940, 950 and 910, the adjusted program start voltage for the first program start voltage adjusting units 930, 940 and 950 during the first program operation of the first page region 900<0> is defined as the first program start voltage, and the program start voltage corresponding to the first program operation and the second program operation of the second page regions 900<1: K>, 901<0:K>, . . . is defined as the second program start voltage. Thus, in a case in which the initialized first program start voltage and the initialized second program start voltage set forth in FIG. 15 are applied to the operation of the first page region 900<0>, all of them can be replaced with the first program start voltage of the first page region 900<0>. In a case in which the initialized first program start voltage and the initialized second program start voltage set forth in FIG. 15 are applied to the operation of the second page regions 900<1: K>, 901<0:K>, . . . , all of them can be replaced with the second program start voltage of the second page regions 900<1:K>, 901<0:K>, . . . .

After the power is supplied (that is, not powered off or powered back on after a power-off) to the nonvolatile memory device (step 1500), the program operation to be performed is determined (step 1510). More specifically, since the operation illustrated in FIG. 15 is the operation of the second program start voltage adjusting units 930, 940, 950 and 910 for the second page regions 900<1:K>, 901<0:K>, . . . , the first program operation illustrated in FIG. 15 performs the first program operation of the second page regions 900<1:K>, 901<0:K>, . . . , and the second program operation illustrated in FIG. 15 performs the second program operation of the second page regions 900<1:K>, 901<0:K>, . . . .

Here, through the program operations illustrated in FIG. 11 for the first page region, the program pulse application count number PD[0] is stored in, for example, the plurality of auxiliary cells BL<M:N−1> of the first page region 900<0>. Thus, in the first program operation of the second page regions 900<1:K>, 901<0:K>, . . . performed through the first program operation illustrated in FIG. 15, the program pulse application count number PD[0] stored in the auxiliary cells BL<M:N−1> of the first page region 900<0> is read (step 1530).

The program pulse application count number PD[0] stored in and read from the auxiliary cells BL<M:N−1> of the first page region 900<0> by the operation of the voltage select signal generating unit 9102 is compared with the threshold value of the second page regions 900<1:K>, 901<0:K>, . . . , (step 1532) and the initialized first program start voltage of the second page regions 900<1:K>, 901<0:K> is adjusted or unadjusted according to the comparison output (step 1532).

More specifically, when the read program pulse application count number PD[0] counted until the 1 bit pass is detected in the first page region 900<0> is not larger than the threshold value of the second page regions 900<1:K>, 901<0: K>, the voltage select signal VSEL is not activated and the initialized first program start voltage of the second page regions 900<1:K>, 901<0:K> is not adjusted. However, in a case in which the read program pulse application count number PD[0] counted until the 1 bit pass is detected in the first page region 900<0> is larger than the threshold value of the second page regions 900<1:K>, 901<0:K>, . . . , the voltage select signal VSEL is activated. When the voltage select signal VSEL is activated, according to an example, the product of the read program pulse application count number PD[0] and the step voltage is added to the initialized first program start voltage to be used as the first program start voltage of the second page regions 900<1:K>, 901<0:K>, . . . and is set as a new first program start voltage of the second page regions 900<1:K>, 901<0:K>, . . . (step 1533). According to another example, a difference between the program pulse application count number PD[0] read in response to the activation of the voltage select signal VSEL and the threshold value of the second page regions 900<1:K>, 901<0:K>, . . . is multiplied by a step voltage, and a voltage corresponding to the resultant value is added to the initialized first program start voltage, where the summed voltage is used as a new first program start voltage of the second page regions 900<1:K>, 901<0:K>. The final summed voltage can be set as a new first program start voltage of the second page regions 900<1:K>, 901<0: K>, . . . (step 1533).

As discussed above, in a case in which the read program pulse application count number PD[0] counted until the 1 bit pass is detected in the first page region 900<0> is smaller than the threshold value of the second page regions 900<1:K>, 901<0:K>, . . . , the voltage select signal VSEL of the voltage select signal generating unit 9102 is deactivated. Thus, the initialized first program start voltage, 901<0:K>, . . . , is used without change (step 1632) as the first program start voltage of the second page regions 900<1:K>.

According to an example, the threshold value of the second page regions 900<1:K>, 901<0:K>, . . . can be selected differently according to different needs such as the characteristics of cells. According to an example, when the read program pulse application count number PD[0] is smaller than 2, it may be considered as trivial. Thus, in such a case, 2 may be set as the threshold value. In addition, in a case in which the read program pulse application count number PD[0] counted until the 1 bit pass is detected in the first page region 900<0> becomes larger than the threshold value of the second page regions 900<1:K>, 901<0:K>, . . . and the new first program start voltage of the second page regions 900<1:K>, 901<0: K>, . . . is set, it is substantially identical to the state in which the first program start voltage of the first page region 900<0> is set through the operation of the first program start voltage adjusting units 930, 940 and 950. Therefore, the operations 1530, 1531 and 1532 among the first program operations illustrated in FIG. 15 determine whether the first program start voltage of the second page regions 900<1:K>, 901<0: K>, . . . is adjusted or unadjusted to equal the initialized first program start voltage.

Figure 15:
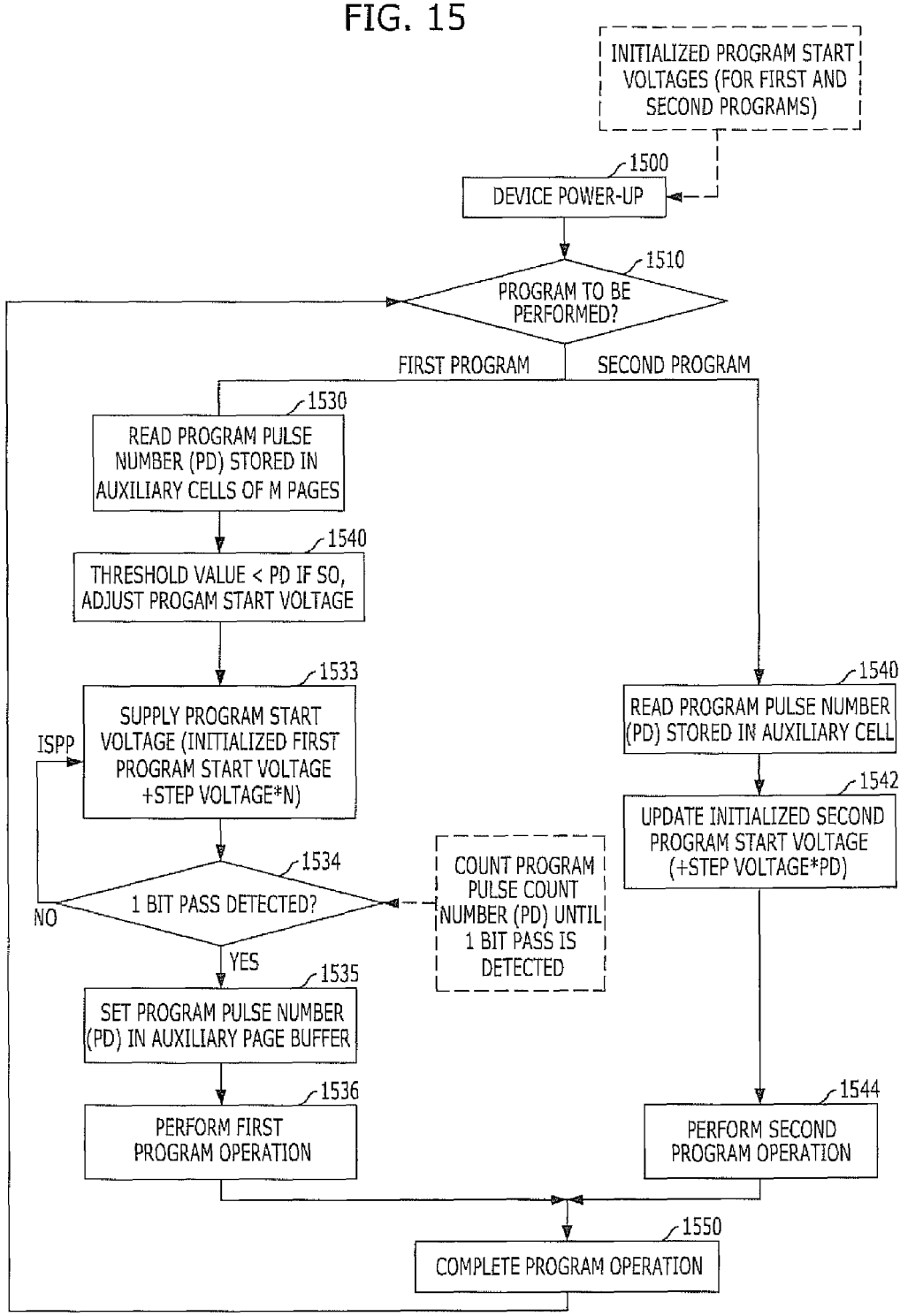
FIG. 15 is a flowchart explaining a program operation of the nonvolatile memory device of FIG. 14.

Once the operations 1530, 1531 and 1532 for the first program operations illustrated in FIG. 15 are completed, the operation for determining the second program start voltage of the second page regions 900<1:K>, 901<0:K>, . . . is substantially identical to the steps for determining the second program start voltage in FIG. 11. More specifically, the program pulse application count number PD counted until the 1 bit pass is detected in the first program operation of the second page regions 900<1:K>, 901<0:K> is stored in the plurality of auxiliary cells BL<M:N−1> of the second page regions 900<1:K>, 901<0:K>, . . . .

The second program operation illustrated in FIG. 15 is the same as the steps performed for the second program operation illustrated in FIG. 11. More specifically, the second program start voltage corresponding to the second program operation of the second page regions 900<1:K>, 901<0:K>, . . . is determined based on the program pulse application count number PD counted until the first bit pass is detected and stored in the auxiliary cells BL<M:N−1> of the second page regions 900<1:K>, 901<0:K>, . . . .

In FIGS. 9, 11 and 13 to 15, when the plurality of cells included in the memory cell array 900 are SLCs, the information used for finding the initial start voltage suitable for the characteristics of the first page region 900<0>, that is, the program pulse application count number (PD) counted until the 1 bit pass is detected, in the program operation of the first page region 900<0> is stored in the plurality of auxiliary cells BL<M:N−1> of the first page region 900<0> by using the first program steps in FIG. 11. Then, the initial start voltage suitable for the operation characteristics of the second page regions 900<1:K>, 901<0:K>, . . . can be found based on the information used for finding the initial start voltage suitable for the operation characteristics of the first page region 900<0> during the program operation of the second page regions 900<1:K>, 901<0:K>, . . . by using the second program steps in FIG. 11. In this manner, the time for performing the program operation of the second page regions 900<1:K>, 901<0:K>, . . . can be reduced.

In addition, when the plurality of cells included in the memory cell array 900 are MLCs, the information used for finding the initial start voltage suitable for the operation characteristics of the first page region 900<0>, that is, the program pulse application count number (PD) in the first program operation of the first page region 900<0>, is stored in the plurality of auxiliary cells BL<M:N−1> of the first page region 900<0> using the first program steps of FIG. 11. Then, the information is applied to the second program operation of the first page region 900<0> using the second program steps of FIG. 11, thereby significantly reducing time for performing the second program operation of the first page region. In addition, the initial start voltage suitable for the operation characteristics of the second page regions 900<1:K>, 901<0: K>, . . . can be found using the first program steps of FIG. 15, during the first program operation of the second page regions 900<1:K>, 901<0:K>, . . . , based on the information used for finding the start voltage suitable for the operation characteristics of the first page region 900<0>. In this manner, the time for performing the operation of finding the start voltage suitable for the operation characteristics of the second page regions 900<1:K>, 901<0:K>, . . . and the time for performing the first program operation of the second page regions 900<1:K>, 900<0:K>, . . . may be reduced by using the first program steps of FIG. 15.

In accordance with exemplary embodiments of the present invention, after obtaining the information on the optimal program start voltage, which can be known when the first program operation is performed on a unit page region including a plurality of normal cells and a plurality of auxiliary cells and storing the information in the plurality of auxiliary cells, the information is used in performing the second program operation on the unit page region. In this manner, the time for performing the verify operation in the program of the nonvolatile memory device may be reduced.

In addition, after obtaining the information on the optimal program start voltage, which can be known when the program operation is performed on the first page regions each including a plurality of normal cells and a plurality of auxiliary cells and storing the information in the plurality of auxiliary cells of the first page regions, the information is used in performing the program operation on the second page regions. In this manner, the time for performing the verify operation among the program time of the nonvolatile memory device may be reduced.

Furthermore, since the information on the optimal program start voltage is stored in the plurality of auxiliary cells, the information is not lost even when power is not supplied to the nonvolatile memory device. Thus, even when the power supply condition is frequently changed during the data input/output operation, the stored information may be used to reduce the time for performing the verify operation among the program time.

Figure 16:
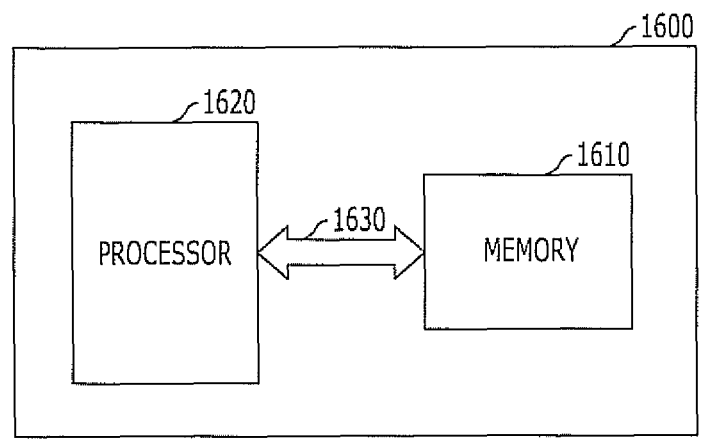
FIG. 16 is a block diagram of an integrated circuit chip according to another aspect of the present invention.

FIG. 16 is a block diagram of an integrated circuit chip according to another aspect of the present invention.

An integrated circuit chip 1600 shown in FIG. 16 includes a nonvolatile memory device 1610 according to embodiments of the present invention as described above. The nonvolatile memory device 1610 includes a flash memory, and shares the integrated circuit chip 1600 with a processor 1620. The nonvolatile memory device 1610 and the processor 1620 are coupled together by a suitable communication line or bus 1630.

In another embodiment of the present application, a plurality of nonvolatile memory device may be included in the integrated circuit chip.

Figure 17:
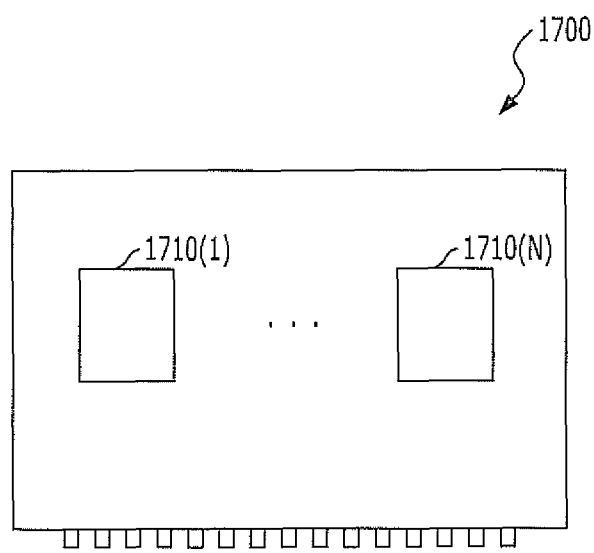
FIG. 17 is a block diagram of a compact memory card according to another aspect of the present invention.

FIG. 17 is a block diagram of a compact memory card according to another aspect of the present invention.

A compact memory card 1700 shown in FIG. 17 includes a plurality of nonvolatile memory devices 1710(1)-1710(N) according to embodiments of the present invention as described above. The compact memory card 1700 may be a single integrated circuit in which the nonvolatile memory devices 1710(1)-1710(N) are embedded.

Figure 18:
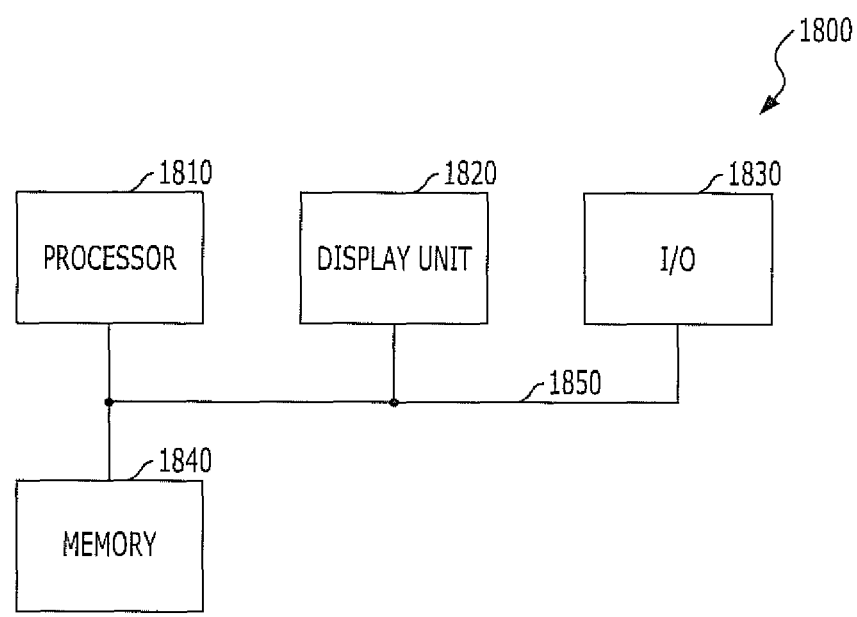
FIG. 18 is a block diagram of an information processing system according to another aspect of the present invention.

FIG. 18 is a block diagram of an information processing system according to another aspect of the present invention.

The information processing system 1800 shown in FIG. 18 includes a processor 1810, a display unit 1820 and an input/output unit 1830 and a nonvolatile memory device 1840 according to embodiments of the present invention as described above.

The nonvolatile memory 1840 and the processor 1810 may be embedded on a single integrated circuit chip such as the integrated circuit chip shown in FIG. 16. The processor 1810, the display unit 1820, the input/output unit 1830 and the nonvolatile memory device 1840 are coupled together by a suitable communication line or bus 1850.

According to another aspect of the present application, a user may input instructions to the processor 1810 or the nonvolatile memory device 1840 through the input/output unit 1830. The input/output unit 1830 may be a keyboard or other device to allow the user to communication with the information processing system 1800.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
    a page region including a plurality of normal cells and a plurality of auxiliary cells;
    a detecting unit configured to output a pass signal when at least one cell is programmed with a voltage higher than a reference voltage among program target cells of the page region;
    a count storing unit configured to store a count in the plurality of auxiliary cells during a first program operation for the page region, wherein the count indicates a total number of program pulses applied to the at least one cell until the pass signal is outputted from the detecting unit; and
    a voltage setting unit configured to set a program start voltage for a second program operation of the page region based on the count stored in the plurality of auxiliary cells.

2. The nonvolatile memory device of claim 1, further comprising a counting unit configured to count the program pulses and transfer the count to the count storing unit.

3. The nonvolatile memory device of claim 1, further comprising:
    a normal page buffering unit corresponding to the plurality of normal cells; and
    an auxiliary page buffering unit corresponding to the plurality of auxiliary cells.

4. The nonvolatile memory device of claim 3, wherein the count storing unit is configured to output the count to the auxiliary page buffering unit.

5. The nonvolatile memory device of claim 1, wherein the voltage setting unit is configured to read the count stored in the plurality of auxiliary cells, obtain a sum voltage by adding an initial program voltage for the second program operation with a voltage obtained by multiplying the count with a unit step voltage, and set the sum voltage as the program start voltage of the second program operation.

6. The nonvolatile memory device of claim 1,
    wherein the voltage setting unit is configured to read the count stored in the plurality of auxiliary cells, and
    wherein, when the count is larger than a threshold value, the voltage setting unit is further configured to obtain a sum voltage by adding an initial voltage for the second program operation with a voltage obtained by multiplying a difference between the count and the threshold value with a unit step voltage and set the sum voltage as the program start voltage of the second program operation, and
    when the read count is equal to or less than the threshold value, the voltage setting unit is configured to provide the initial voltage for the first program operation as the program start voltage of the second program operation.

7. The nonvolatile memory device of claim 1, wherein
    the normal cells and the auxiliary cells are multi level cells (MLCs),
    the first program operation is a least significant bit (LSB) program operation, and
    the second program operation is a most significant bit (MSB) program operation.

8. A nonvolatile memory device comprising:
    first and second page regions sharing word lines, wherein the first and second page regions each include a plurality of normal cells and a plurality of auxiliary cells;
    a pass detecting unit configured to output a pass signal when at least one cell is programmed with a voltage higher than a reference voltage among program target cells of the first page region;
    a count storing unit configured to store a count in the plurality of auxiliary cells of the first page region during a first program operation of the first page region, wherein the count indicates a total number of program pulses applied to the at least one cell until the pass signal is outputted from the pass detecting unit; and
    a voltage setting unit configured to set a program start voltage for at least one of the first and second page regions based on the count.

9. The nonvolatile memory device of claim 8, further comprising a counting unit configured to count the program pulses and transfer the count to the count storing unit.

10. The nonvolatile memory device of claim 9, further comprising:
    a normal page buffering unit corresponding to the plurality of normal cells of the first and second page regions; and
    an auxiliary page buffering unit corresponding to the plurality of auxiliary cells of the first and second page regions.

11. The nonvolatile memory device of claim 8, wherein the normal cells and the auxiliary cells of the first page region and the normal cells and the auxiliary cells of the second page region are single level cells (SLCs).

12. The nonvolatile memory device of claim 10, wherein the count storing unit is configured to receive the count from the auxiliary page buffering unit corresponding to the plurality of auxiliary cells of the first page region.

13. The nonvolatile memory device of claim 8, wherein the setting unit is configured to read the count, obtain a sum voltage by adding an initial program voltage with a voltage obtained by multiplying a unit step voltage, and set the sum voltage as the program start voltage for the at least one of the first and second page regions.

14. The nonvolatile memory device of claim 8,
    wherein the voltage setting unit is configured to read the count, and
    wherein, when the read count is larger than a threshold value, the voltage setting unit is further configured to obtain a sum voltage by adding an initial voltage for the program start voltage with a voltage obtained by multiplying a difference between the count and the threshold value with a unit step voltage and set the sum voltage as the program start voltage of the at least one of the first and second page regions, and
    when the read count is equal to or less than the threshold value, the voltage setting unit is configured to provide the initial voltage for the program start voltage as the program start voltage for the at least one of the first and second page regions.

15. The nonvolatile memory device of claim 10, wherein the normal cells and the auxiliary cells of the first page region and the normal cells and the auxiliary cells of the second page region are multi level cells (MLCs).

16. The nonvolatile memory device of claim 15, wherein the count storing unit is configured to output the count to the auxiliary page buffering unit corresponding to the plurality of auxiliary cells of the first page region during the first program operation of the first page region.

17. The nonvolatile memory device of claim 15, wherein the voltage setting unit is configured to read the count stored in the plurality of auxiliary cells of the first page region, obtain a sum voltage by adding an initial program voltage for the program start voltage to a voltage obtained by multiplying the count with a step voltage, and set the sum voltage as the program start voltage, wherein the program start voltage is used as a program start voltage of the second page region.

18. The nonvolatile memory device of claim 15,
wherein the voltage setting unit is configured to read the program pulse application count number stored in the plurality of auxiliary cells of the first page region, and
wherein, when the read count is larger than a threshold value, the voltage setting unit is further configured to obtain a sum voltage by adding an initial voltage for the program start voltage with a voltage obtained by multiplying a difference between the count and the threshold value with a unit step voltage and set the sum voltage as the program start voltage of the at least one of the first and second page regions, and
when the read count is equal to or less than the threshold value; the voltage setting unit is configured to provide the initial voltage for the program start voltage as the program start voltage for the at least one of the first and second page regions, wherein the program start voltage is used as a program start voltage of the second page region.

19. The nonvolatile memory device of claim 17, wherein the first program operation of the first page region is a least significant bit (LSB) program operation and a second program operation of the first page region is a most significant bit (MSB) program operation.

20. A nonvolatile memory device comprising:
first and second page regions sharing word lines, wherein the first and second page regions each include a plurality of normal cells and a plurality of auxiliary cells;
a pass detecting unit configured to output a pass signal when at least one cell is programmed with a voltage higher than a reference voltage among program target cells of at least one of the first and second page region;
a first voltage adjusting unit configured to store a first count in the plurality of auxiliary cells of the first page region and adjust a first program start voltage according to the stored first count, wherein the first count indicates a total number of program pulses applied to the first page region until the pass signal is outputted from the pass detecting unit; and
a second voltage adjusting unit configured to store a second count in the plurality of auxiliary cells of the second page region and adjust a second program start voltage according to the stored second count, wherein the second count indicates a total number of program pulses applied to the second page region until the pass signal is outputted from the pass detecting unit.

21. The nonvolatile memory device of claim 20, wherein the first voltage adjusting unit comprises:
a first count storing unit configured to store the first count in the plurality of auxiliary cells of the first page region in a first program operation of the first page region; and
a first voltage setting unit configured to set the first program start voltage according to the first count and apply the first program start voltage to a second program operation of the first page region.

22. The nonvolatile memory device of claim 21, wherein the second program start voltage adjusting unit comprises:
a voltage select signal generating unit configured to compare a threshold value with the first count and generate a voltage select signal;
a second count storing unit configured to store the second count in the plurality of auxiliary cells of the second page region during a first program operation of the second page region, wherein an initial program start voltage is adjusted according to the voltage select signal and applied during a second program operation of the second page region; and
a second voltage setting unit configured to set the second program start voltage according to the second count and apply the second program start voltage during a second program operation of the second page region.

23. The nonvolatile memory device of claim 22, further comprising a counting unit configured to count program pulses and output the first count to the first count storing unit and further configured to output the second count to the second count storing unit.

24. The nonvolatile memory device of claim 20, further comprising:
a normal page buffering unit corresponding to the plurality of normal cells of the first and second page regions; and
an auxiliary page buffering unit corresponding to the plurality of auxiliary cells of the first and second page regions.

25. The nonvolatile memory device of claim 24, wherein the first storing unit is configured to output the first count to the auxiliary page buffering unit corresponding to the plurality of auxiliary cells of the first page region.

26. The nonvolatile memory device of claim 25, wherein the second storing unit is configured to output the second count to the auxiliary page buffering unit corresponding to the plurality of auxiliary cells of the second page region.

27. The nonvolatile memory device of claim 22, wherein the voltage select signal generating unit is configured to read the first count stored in the plurality of auxiliary cells of the first page region, activate the voltage select signal when the read first count is larger than a threshold value, adjust an initial program voltage for the second program start voltage and apply the adjusted program voltage as the second program start voltage for the first program operation of the second page region, and
when the read first count number is equal to or less than the threshold value, the voltage select signal generating unit is configured to deactivate the voltage select signal and apply the initial program voltage as the second program start voltage for the first program operation of the second page region.

28. The nonvolatile memory device of claim 22, wherein the first voltage setting unit is configured to read the first count stored in the plurality of auxiliary cells of the first page region, obtain a sum voltage by adding an initial program voltage for the first program start voltage with a voltage obtained by multiplying the read first count with a step voltage, and apply the sum voltage as the first program start voltage for the second program operation of the first page region.

29. The nonvolatile memory device of claim 22, wherein, the first voltage setting unit is configured to read the first count stored in the plurality of auxiliary cells of the first page region and,
when the first count is larger than a threshold value, obtain a sum voltage by adding an initial program voltage for the first program start voltage with a voltage obtained by multiplying a step voltage with a difference between the first count and the threshold value and apply the sum voltage as the first program start voltage for the second program operation of the first page region, and
when the first count is equal to or less than the threshold value, apply the initial program voltage as the first program start voltage for the second program operation of the first page region.

30. The nonvolatile memory device of claim 22, wherein the second voltage setting unit is configured to read the second count stored in the plurality of auxiliary cells of the second page region, obtain a sum voltage by adding an initial program voltage for the second program start voltage with a voltage obtained by multiplying the second count and a step voltage, and apply the sum voltage as the second program start voltage for a first program operation of the second page region.

31. The nonvolatile memory device of claim 22,
wherein the second voltage setting unit is configured to read the first count stored in the plurality of auxiliary cells of the second page region, obtain a sum voltage by adding an initial program voltage for the second program start voltage to a voltage obtained by multiplying a step voltage with a difference between the second count and the threshold value when the second count is larger than the threshold value, and apply the sum voltage as the second program start voltage for a first program operation of the second page region, and
wherein, when the second count is equal to or less than the threshold value, the second voltage setting unit is configured to apply the initial program voltage for the second program start voltage as the second program start voltage for the first program operation of the second page region.

32. The nonvolatile memory device of claim 20, wherein,
the normal cells and the auxiliary cells of the first page region and the normal cells and the auxiliary cells of the second page region are multi level cells (MLCs),
a first program operation of the first and second page regions is a least significant bit (LSB) program operation, and
a second program operation of the first and second page regions is a most significant bit (MSB) program operation.

33. A method for operating a nonvolatile memory device, the method comprising:
performing a first program operation of a page region by applying an initial program start voltage, the page region including a plurality of normal cells and a plurality of auxiliary cells;
counting program pulses applied to the page region until at least one cell is programmed with a voltage higher than a verify voltage among program target cells of the page region and output a count during the first program operation;
storing the count in the plurality of auxiliary cells;
setting a program start voltage according to the count; and
performing a second program operation of the page region by applying the program start voltage determined in the setting operation.

34. The method of claim 33, wherein the storing of the count comprises:
outputting the count to an auxiliary page buffer corresponding to the plurality of auxiliary cells; and
completing the first program operation after the outputting of the count to the auxiliary page buffer.

35. The method of claim 33, wherein the setting of the program start voltage comprises:
reading the count stored in the plurality of auxiliary cells; and
obtaining a sum voltage by adding the initial program start voltage with a voltage obtained by multiplying the count with a step voltage and outputting the sum voltage as the program start voltage for the second program operation of the page region.

36. The method of claim 33, wherein the setting of the program start voltage comprises:
reading the count stored in the plurality of auxiliary cells;
obtaining a sum voltage by adding the initial program start voltage with a voltage obtained by multiplying a step voltage with a difference between the count and a threshold value and outputting the sum voltage as the program start voltage for the second program operation of the page region when the count is larger than the threshold value; and
outputting the initial program start voltage as the program start voltage for the second program operation of the page region when the count is equal to or less than the threshold value.

37. The method of claim 33, wherein,
the normal cells and the auxiliary cells are multi level cells (MLCs),
the first program operation is a least significant bit (LSB) program operation, and
the second program operation is a most significant bit (MSB) program operation.

38. A method for operating a nonvolatile memory device, the method comprising:
performing a program operation of a first page region by applying a first program start voltage, the first page region including a plurality of normal cells and a plurality of auxiliary cells;
performing a program operation of a second page region by applying a second program start voltage, the second page region including a plurality of normal cells and a plurality of auxiliary cells and sharing word lines with the first page region;
counting program pulses applied to the first page region until at least one cell is programmed with a voltage higher than a verify voltage among program target cells of the first page region during the program operation of the first page region and outputting a count;
storing the count in the plurality of auxiliary cells of the first page region; and
setting the second program start voltage according to the count stored in the plurality of auxiliary cells of the first page region.

39. The method of claim 38, wherein the storing of the count comprises:
outputting the count to an auxiliary page buffer corresponding to the plurality of auxiliary cells of the first page region; and completing a program operation of the first page region after the outputting of the count to the auxiliary page buffer corresponding to the plurality of auxiliary cells of the first page region.

40. The method of claim 38, wherein the setting of the second program start voltage comprises:
reading the count stored in the plurality of auxiliary cells of the first page region; and
obtaining a sum voltage by adding an initial program start voltage for the second program start voltage with a voltage obtained by multiplying the count with a step voltage and outputting the sum voltage as the second program start voltage for a second program operation of the first page region.

41. The method of claim 38, wherein the setting of the second program start voltage comprises:
reading the count stored in the plurality of auxiliary cells of the first page region;
obtaining a sum voltage by adding an initial program start voltage for the second program start voltage with a voltage obtained by multiplying a step voltage with a difference between the count and a threshold value and outputting the sum voltage as the second program start voltage for the second program operation of the page region when the count is larger than the threshold value; and
outputting the initial program start voltage as the second program start voltage when the count is equal to or less than the threshold value.

42. The method of claim 38, wherein,
the normal cells and the auxiliary cells of the first page region and the normal cells and the auxiliary cells of the second page region are multi level cells (MLCs),
a program operation of the first page region is divided into first and second program operations of the first page region,
a program operation of the second page region is divided into first and second program operations of the second page region,
the counting operation, the storing operation, and the setting operation are performed during the first program operation of the first page region, and
the first program operation of the second page region is performed according to the set program start voltage.

43. The method of claim 42, wherein the first program operations of the first and second page regions are each a least significant bit (LSB) program operation and the second program operations of the first and second page regions are each a most significant bit (MSB) program operation.

44. A method for operating a nonvolatile memory device, the method comprising:
performing a program operation of a first page region by applying a first program start voltage, wherein the first page region includes a plurality of normal cells and a plurality of auxiliary cells;
storing a count in the plurality of auxiliary cells of the first page region, wherein the count indicates a total number of program pulses applied to the first page region before at least one cell is programmed with a voltage higher than a verify voltage among program target cells of the first page region;
setting the first program start voltage according to the count during the program operation of the first page region;
performing a program operation of a second page region by selecting a second program start voltage, wherein the second page region includes a plurality of normal cells and a plurality of auxiliary cells and shares strings with the first page region; and
determining a value of a voltage select signal for the selection of the second program start voltage according to the count during the program operation of the second page region.

45. The method of claim 44, wherein the storing of the program pulse application count number comprises:
counting the total number of program pulses;
outputting the count to an auxiliary page buffer corresponding to the plurality of auxiliary cells of the first page region; and
completing a program operation of the first page region after the outputting of the count to the auxiliary page buffer corresponding to the plurality of auxiliary cells of the first page region.

46. The method of claim 44, wherein the setting of the first program start voltage comprises:
reading the count stored in the plurality of auxiliary cells of the first page region; and
obtaining a sum voltage by adding an initial program start voltage for the first program start voltage with a voltage obtained by multiplying the count with a step voltage and outputting the sum voltage as the first program start voltage for a second program operation of the first page region.

47. The method of claim 44, wherein the setting of the first program start voltage comprises:
reading the count stored in the plurality of auxiliary cells of the first page region;
obtaining a sum voltage by adding an initial program start voltage for the first program start voltage with a voltage obtained by multiplying a step voltage with a difference between the count and a threshold value and outputting the sum voltage as the first program start voltage for a second program operation of the first page region when the count is larger than the threshold value; and
outputting the initial program start voltage as the first program start voltage when the count is equal to or less than the threshold value.

48. The method of claim 44, wherein the determining of the value of the voltage select signal comprises:
reading the count stored in the plurality of auxiliary cells of the first page region;
activating the voltage select signal when the count is larger than a threshold value and adjusting an initial program start voltage for the second program start voltage and applying the adjusted program start voltage as the second program start voltage for the program operation of the second page region; and
deactivating the voltage select signal when the count is equal to or less than the threshold value and applying the initial program start voltage as the second program start voltage for the program operation of the second page region.

49. The method of claim 44, wherein the normal cells and the auxiliary cells of the first page region and the normal cells and the auxiliary cells of the second page region are multi level cells (MLCs) and the method further comprises:
storing a second count in the plurality of auxiliary cells of the second page region, wherein the second count indicates a total number of program pulses applied to the second page region until at least one cell is programmed with a voltage higher than a verify voltage among program target cells of the second page region during the program operation of the second page region;

setting a program start voltage for a second program operation of the second page region according to the second count, wherein the program operation of the first page region is divided into first and second program operations of the first page region and the program operation of the second page region is divided into first and second program operations of the second page region.

50. The method of claim 49, wherein, the operation of storing the first count in the plurality of auxiliary cells of the first page region and the operation of setting the first program start voltage are performed during the first and second program operations of the first page region, respectively, applying the first program start voltage to the second program operation of the first page region, the operation of storing the second count number in the plurality of auxiliary cells of the second page region and the operation of setting the second program start voltage are performed during the first and second program operations of the second page region, respectively, and applying the second program start voltage to the second program operation of the second page region.

51. The method of claim 49, wherein the first program operations of the first and second page regions are each a least significant bit (LSB) program operation and the second program operations of the first and second page regions are each a most significant bit (MSB) program operation.

* * * * *